(12) United States Patent
Lai

(10) Patent No.: US 6,695,635 B1
(45) Date of Patent: Feb. 24, 2004

(54) ZERO INSERTION/EXTRACTION FORCE INTEGRATED CIRCUIT SOCKET

(76) Inventor: Kuang-Chih Lai, No. 2, Lane 10, Sheng-Li Street, Tu-Cheng City Taipei Hsien (TW)

(*) Notice: Subject to any disclaimer, the term of this patent is extended or adjusted under 35 U.S.C. 154(b) by 0 days.

(21) Appl. No.: 10/436,255

(22) Filed: May 13, 2003

(30) Foreign Application Priority Data

Apr. 17, 2003 (TW) .......................................... 092206071

(51) Int. Cl.$^7$ ............................................. H01R 13/625
(52) U.S. Cl. ..................................... 439/342; 439/259
(58) Field of Search ........................ 439/259, 260–265, 439/267, 342

(56) References Cited

U.S. PATENT DOCUMENTS

| | | | |
|---|---|---|---|
| 5,387,121 A | 2/1995 | Kurz | 439/342 |
| 5,443,591 A * | 8/1995 | Tsai | 439/342 |
| 5,456,613 A | 10/1995 | McHugh | 439/268 |
| 5,569,045 A * | 10/1996 | Hsu | 439/342 |
| 5,679,020 A * | 10/1997 | Lai et al. | 439/342 |
| 6,231,367 B1 * | 5/2001 | Hsiao et al. | 439/342 |
| 6,371,785 B1 * | 4/2002 | Howell et al. | 439/342 |

* cited by examiner

Primary Examiner—Hien Vu
(74) Attorney, Agent, or Firm—Rosenberg, Klein & Lee

(57) ABSTRACT

A zero insertion/extraction force integrated circuit socket including an insulating socket having multiple pivot arch recesses and an L-shaped driving member having a driving section. The driving section has multiple pivot arch shaft sections which are respectively rotatably engaged in the pivot arch recesses. The integrated circuit socket further includes a slide cover having multiple driven faces. The driving section has multiple driving cams which respectively slidably contact with the driven faces for driving the slide cover to slide between a separation position and a contact position. The pivot arch shaft sections of the driving section and one of the driving cams are spaced from each other without connecting with each other. Therefore, the cross-sectional area of the driving section is smaller, while the strength of the driving section is greater.

15 Claims, 23 Drawing Sheets

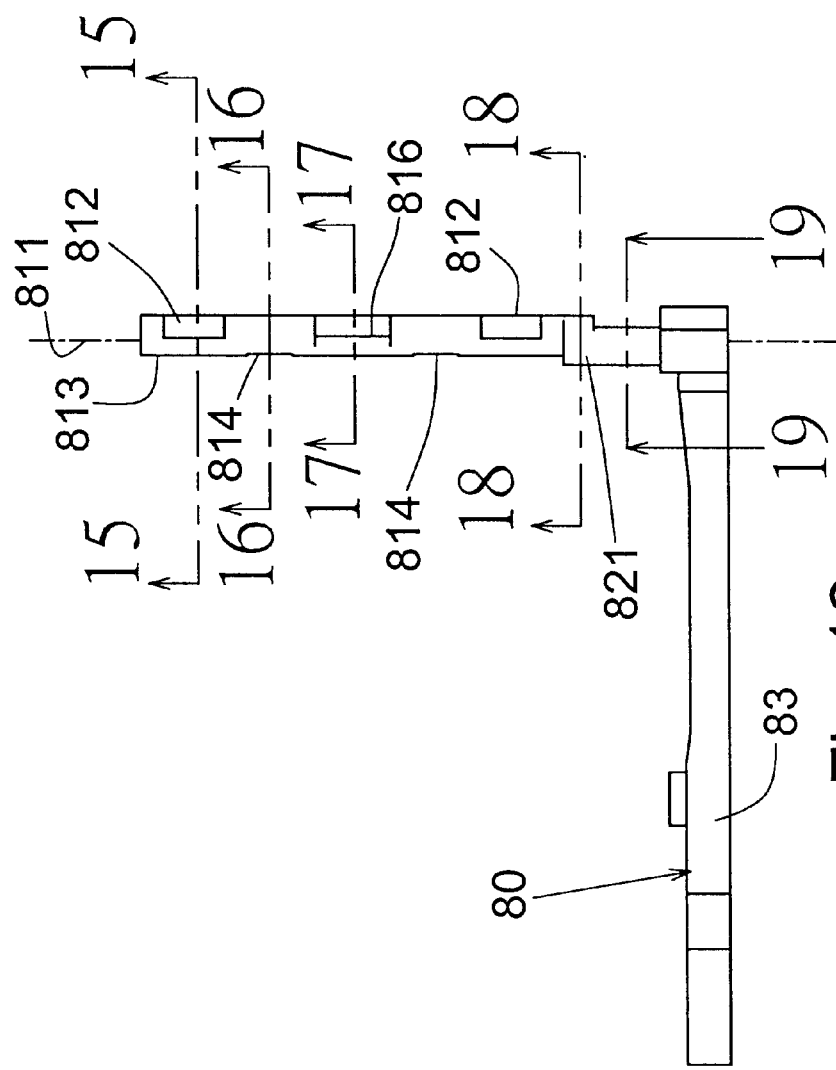

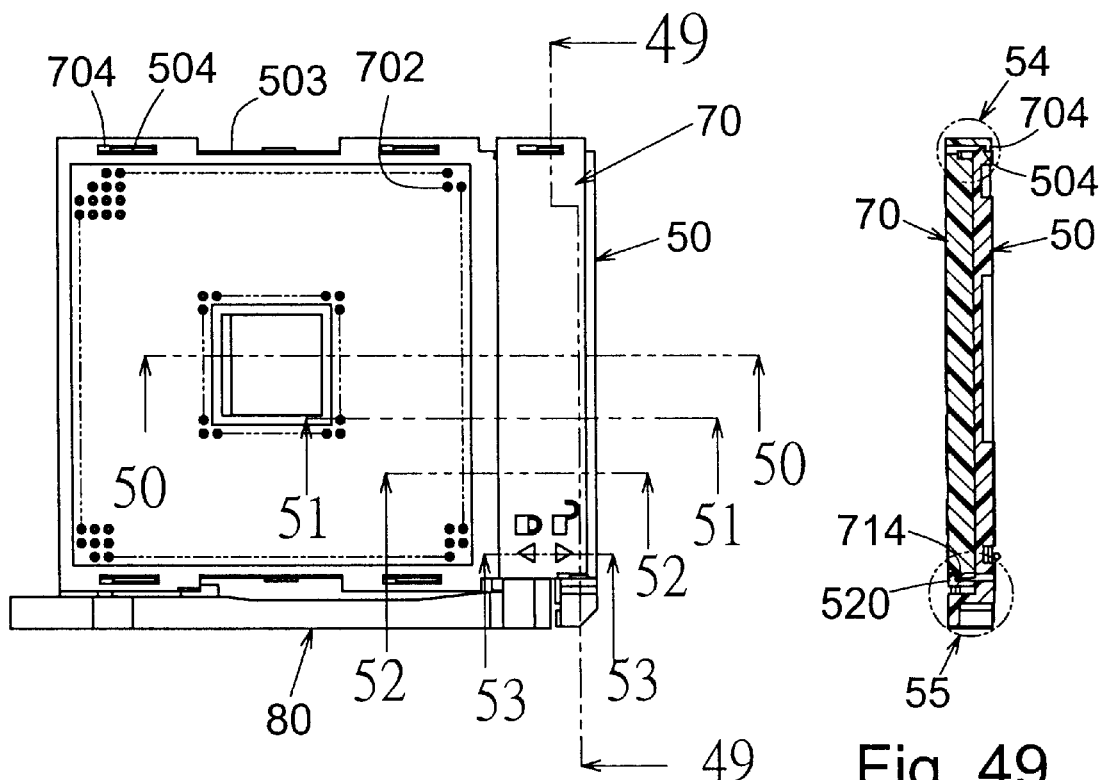
Fig. 47
Fig. 49
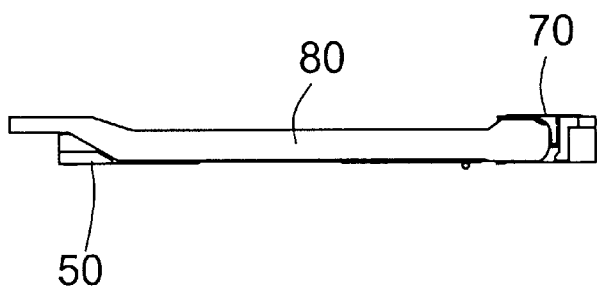
Fig. 48

ZERO INSERTION/EXTRACTION FORCE INTEGRATED CIRCUIT SOCKET

BACKGROUND OF THE INVENTION

1. Field of the Invention

The present invention is related to a zero insertion/extraction force integrated circuit socket, and more particularly to a driving structure of the socket for driving a slide cover to slide along the insulating socket.

2. Description of the Prior Art

Zero insertion/extraction force integrated circuit socket is for an integrated circuit such as a central processor unit (CPU) to insert therein with nearly zero force. After inserted, the CPU is electrically connected with the main board of a computer. When it is necessary to upgrade the computer, the CPU is extracted from the socket with nearly zero force to replace the CPU with an upgraded product.

In order to achieve the object of zero insertion/extraction force, a slide cover is added to the bottommost insulating socket. The slide cover is slidable along the insulating socket. The multiple insertion pins of the CPU are passed through the slide cover and then inserted into the insulating socket. However, after inserted, the insertion pins do not directly contact with the multiple conductive members inlaid in the insulating socket so that the insertion force is nearly zero. Then, by means of a driving structure disposed between the insulating socket and the slide cover, the slide cover is driven and slided to simultaneously make the insertion pins of the CPU slide into the contact sections of the conductive members and respectively electrically contact with the conducting members.

When extracting the CPU, the driving structure is operated to force the slide cover to slide in a reverse direction, whereby the insertion pins of the CPU are simultaneously detached from the conductive members. Thereafter, the CPU can be easily extracted. It is known from the above that the driving structure plays a very important role in the operation.

There are various types of driving structures. The earliest and most typical driving structure is disclosed in U.S. Pat. Nos. 5,387,121 and 5,456,613. An U-shaped driving member is clamped on one side of the zero insertion/extraction force (zero insertion force) integrated circuit socket. A driving section of the U-shaped driving member is positioned between the insulating socket and the slide cover and is manufactured as a cam. An operating section of the L-shaped driving member is exposed to outer side of the socket. The operating section is pinched by fingers to turn the driving section for driving the slide cover to slide.

The L-shaped driving member of the above driving structure has some shortcomings as follows:

1. The driving cam of the driving section of the L-shaped driving member must be large enough to drive the slide cover to slide through a sufficient travel. Under such circumstance, the cross-section of the driving section will be too large. As a result, the slide cover will protrude to thicken the socket.

2. The driving cam of the driving section of the L-shaped driving member is too large so that the gradient of the cross-section of the entire driving section will be too large. As a result, the structural strength of the driving section will be too weak and likely to break.

SUMMARY OF THE INVENTION

It is therefore a primary object of the present invention to provide a zero insertion/extraction force integrated circuit socket. In the prior art, the driving cam of the driving section of the L-shaped driving member must be large enough to drive the slide cover to slide through a sufficient travel. Under such circumstance, the cross-section of the driving section will be too large. As a result, the slide cover will protrude to thicken the socket. The above problem existing in the prior art is solved by the present invention.

It is a further object of the present invention to provide the above zero insertion/extraction force integrated circuit socket. In the prior art, the driving cam of the driving section of the L-shaped driving member is too large so that the gradient of the cross-section of the entire driving section will be too large. As a result, the structural strength of the driving section will be too weak and likely to break. The above problem existing in the prior art is solved by the present invention.

It is still a further object of the present invention to provide the above zero insertion/extraction force integrated circuit socket. The first pivot arch shaft section, first driving cam, second pivot arch shaft section, second driving cam and the third driving cam are formed on the driving section of the driving member stage by stage. Therefore, each cross-section of the driving section can be smaller and the cross-sectional area of each stage can be larger to enhance the torque strength.

It is still a further object of the present invention to provide the above zero insertion/extraction force integrated circuit socket. The first pivot arch shaft section, second pivot arch shaft section and the third driving cam are axially stage by stage formed on the driving section of the driving member and spaced from each other. The cross-sections of the first pivot arch shaft section, second pivot arch shaft section and the third driving cam are not connected with each other. Therefore, each cross-section of the driving section can be smaller and the cross-sectional area of each stage can be larger to enhance the torque strength.

It is still a further object of the present invention to provide the above zero insertion/extraction force integrated circuit socket. The first pivot arch recess and second pivot arch recess of the insulating socket cooperate with the first receiving dent and second receiving dent of the slide cover to together support the first pivot arch shaft section, second pivot arch shaft section and the first arched face of the driving section of the driving member. Therefore, the first pivot arch shaft section and second pivot arch shaft section can be stably pivotally disposed in the insulating socket and smoothly rotated.

It is still a further object of the present invention to provide the above zero insertion/extraction force integrated circuit socket. A reinforcing section is disposed at the opening of the first receiving section of the insulating socket for enhancing the strength of the opening of the first receiving section.

It is still a further object of the present invention to provide the above zero insertion/extraction force integrated circuit socket. The portion of the driving section near the operating section, that is, the position of the reinforcing section aligned with the opening of the first receiving section of the insulating socket is formed with corresponding first recess and second recess for avoiding the reinforcing section. The other side of the driving section is formed with reinforcing section corresponding to the first and second recesses. The reinforcing section is bridged between the first and second recesses, whereby the cross-sectional area of the driving section is larger to enhance the torque strength.

It is still a further object of the present invention to provide the above zero insertion/extraction force integrated circuit socket. A corner of the insulating socket is formed with a latch tenon for slidably latching with the slide cover and preventing the driving member from being over-turned.

It is still a further object of the present invention to provide the above zero insertion/extraction force integrated circuit socket. A corner of the insulating socket is formed with a locating projecting section and resilient latch section for stopping the operating section of the driving member, whereby when the operating section is rotated to an erect state, the operating section is latched and located without falling down.

According to the above objects, the zero insertion/extraction force integrated circuit socket of the present invention includes an insulating socket, multiple conductive members, a slide cover and a driving member.

The insulating socket has a first slide connecting face, multiple insertion holes and a first receiving section.

The first slide connecting face is positioned on one face of the insulating socket. The multiple insertion holes are arranged on the first slide connecting face and pass through the insulating socket. Two first guiding edges are respectively disposed on two opposite edges of the insulating socket. Each of the guiding edges has a first latch section projecting therefrom. The first receiving section is formed on one side of the insulating socket and communicates with the first slide connecting face. The first receiving section has a first pivot arch recess, a first receiving dent, a second pivot arch recess and a second receiving dent.

A first axis serves as the arch center of the first pivot arch recess. The first receiving dent is connected with the first pivot arch recess. The first axis serves as the arch center of the second pivot arch recess. The second and first pivot arch recesses together form a U-shaped pivot section. The second receiving dent is connected with the second pivot arch recess.

The multiple conductive members are inserted in the insertion holes of the insulating socket one to one. The conductive members pass through the insertion holes to electrically contact with the circuit board.

The slide cover has a second slide connecting face, multiple through holes, two second guiding edges and a second receiving section. The second slide connecting face is positioned on one face of the slide cover to slidably contact with the first slide connecting face of the insulating socket. A direction in which the slide cover slides relative to the insulating socket is defined as sliding path. The multiple through holes are arranged on the second slide connecting face of the slide cover and pass through the slide cover, whereby multiple insertion pins of an integrated circuit can be inserted through the through holes into the insertion holes of the insulating socket. The two second guiding edges are respectively disposed on two opposite edges of the slide cover. Each guiding edge has a second latch section. The second latch section is slidably latched with the first latch section of the insulating socket, whereby the first and second guiding edges and the first and second slide connecting faces together guide the slide cover to slide relative to the insulating socket.

The second receiving section is formed on one side of the slide cover. The second receiving section and the first receiving section of the insulating socket are mated to form a receiving cavity.

The second receiving section has: a first receiving dent, a second receiving dent and a third receiving dent.

The first receiving dent has a first driven face not parallel to the second slide connecting face. The second receiving dent has a second driven face not parallel to the second slide connecting face. The third receiving dent has a third driven face not parallel to the second slide connecting face.

The driving member has a driving section and an operating section. The driving section is hidden in the receiving cavity formed by the first receiving section of the insulating socket and the second receiving section of the slide cover. The driving section is pivotally rotatable about the first axis of the receiving cavity relative to the insulating socket and the slide cover.

The driving section has a second axis, a first pivot arch shaft section, a first driving cam, a second pivot arch shaft section, a second driving cam and a third driving cam.

The second axis coincides with the first axis of the first receiving section of the insulating socket. The second axis serves as the arch center of the first pivot arch shaft section. The first pivot arch shaft section is pivotally connected with the first pivot arch recess of the first receiving section. The first driving cam is radially connected with one side of the first pivot arch shaft section. The first driving cam slidably contacts with the first driven face of the slide cover for driving the slide cover to slide to a contact position where the insertion pins of the integrated circuit fully contact with the conductive members. The second axis serves as the arch center of the second pivot arch shaft section. The second pivot arch shaft section is pivotally connected with the second pivot arch recess of the first receiving section of the insulating socket. The second driving cam is radially connected with one side of the second pivot arch shaft section. The second driving cam slidably contacts with the second driven face of the slide cover for driving the slide cover to slide through a first separation travel of the travel from the contact position to a separation position where the insertion pins of the integrated circuit fully separate from the conductive members. The second driving cam is radially spaced from the first driving cam by a first arch angle. The third driving cam slidably contacts with the third driven face of the slide cover for driving the slide cover to slide through a second separation travel of the travel from the contact position to the separation position where the insertion pins of the integrated circuit fully separate from the conductive members. The third driving cam is spaced from the first driving cam by a second arch angle which is smaller than the first arch angle.

The operating section is perpendicularly integrally connected with one end of the driving section and exposed to outer side of the insulating socket and the slide cover, whereby by means of shifting the operating section, the driving member is rotated about the first axis, making the second driving cam and third driving cam of the driving member drive the slide cover to slide to the separation position where the insertion pins of the integrated circuit fully separate from the conductive members. At this time, the position where the driving member is positioned is defined as a first position. The first driving cam of the driving member serves to drive the slide cover to slide from the separation position to the contact position where the insertion pins of the integrated circuit just fully contact with the conductive members. At this time, the position where the driving member is positioned is defined as a second position. In the second position, the operating section of the driving member has not yet attached to the locating section of the slide cover. When the operating section of the driving member fully attaches to the locating section of the slide cover, the position where the driving member is positioned is defined as a third position.

In the above zero insertion/extraction force integrated circuit socket, the slide cover further includes a projecting section projecting from the second slide connecting face. The projecting section is positioned between the second receiving section and the through hole and adjacent to one side of the second receiving section. The first driven face extends to one lateral face of the projecting section. The other lateral face of the projecting section serves as a first stop face.

In the above zero insertion/extraction force integrated circuit socket, the insulating socket further has a dent formed on the insulating socket between the first receiving section and the insertion hole. The dent is adjacent to and communicates with one side of the first receiving section. The dent communicates with the first slide connecting face and corresponds to the projecting section of the slide cover for receiving the projecting section. A face of the dent corresponding to the first stop face of the projecting section serves as a second stop face, whereby when the slide cover reaches the contact position, the first stop face contacts with the second stop face of the insulating socket.

In the above zero insertion/extraction force integrated circuit socket, the driving member further has a first arched face which is radially connected with the first driving cam. The axis of the curvature center of the first arch face coincides with the second axis of the driving member. The distances from every parts of the first arched face to the second axis are not smaller than the distances from every parts of the first driving cam to the second axis, whereby when the driving member reaches the second position, the first driving cam of the driving member keeps contacting with the first driven face of the slide cover. In this travel, the driving member is positioned in the first position or the second position or is positioned between the first and second positions. When the driving member is positioned between the second and third positions, the first arched face always keeps contacting with the first driven face of the slide cover. In this travel, the distances from the first arched face to the second axis is equal so that the slide cover always stably keeps in the contact position.

In the above zero insertion/extraction force integrated circuit socket, the first arched face, first pivot arch shaft section and second pivot arch shaft section of the driving member are rotatably engaged in the first pivot arch recess and second pivot arch recess of the insulating socket and the first receiving dent and second receiving dent of the slide cover, whereby the driving member is pivotally disposed in the first and second pivot arch recesses of the insulating socket and the slide cover.

In the above zero insertion/extraction force integrated circuit socket, a locating projecting section is disposed in a position where the first guiding edge and the first receiving section of the insulating socket intersect each other. The locating projecting section has a locating wall. A rear end of the locating wall is formed with a resilient latch section. A first split is formed on the locating projecting section near the first guiding edge in parallel thereto, whereby the locating wall of the locating projecting section has a rigidity, while the resilient latch section of the locating projecting section has a resilience in a direction along the first split.

In the above zero insertion/extraction force integrated circuit socket, a second split is formed on the locating projecting section near the first guiding edge in parallel thereto, whereby the locating projecting section further has a resilient section. A latch tenon is formed on inner side of the resilient section of the locating projecting section for slidably latching with the slide cover.

In the above zero insertion/extraction force integrated circuit socket, a portion of the operating section of the driving member near the driving section is further formed with: a locating section, when the driving member is positioned in the first position, the locating section contacting with the locating wall of the insulating socket; and a locating latch section formed at rear end of the locating section, the locating latch section being not positioned on the second axis, the driving member being rotated to latch the locating latch section with the resilient latch section of the insulating socket, whereby the operating section of the driving member is kept in a position erect from the insulating socket.

In the above zero insertion/extraction force integrated circuit socket, the driving member has two first pivot arch shaft sections and two second pivot arch shaft sections which are not connected with each other.

In the above zero insertion/extraction force integrated circuit socket, the driving member has multiple first pivot arch shaft sections and multiple second pivot arch shaft sections which are not connected with each other.

In the above zero insertion/extraction force integrated circuit socket, the number and position of the first pivot arch recess and second pivot arch recess of the insulating socket respectively correspond to the number and position of the first pivot arch shaft sections and second pivot arch shaft sections.

In the above zero insertion/extraction force integrated circuit socket, a reinforcing section is further formed in a communicating portion between the first receiving section and the first slide connecting face of the insulating socket. The thickness from the reinforcing section to the bottom face of the insulating socket is larger than a thickness from the first receiving section to the bottom face of the insulating socket.

In the above zero insertion/extraction force integrated circuit socket, the driving member further has: a first recess; a second recess, when the driving member is positioned in the first position and the third position, the first and second recesses respectively corresponding to the reinforcing section of the insulating socket; and a reinforcing section bridged between the first and second recesses to compensate the thickness of the cross-section of the first and second recesses as to enhance the strength of the driving section of the driving member.

In the above zero insertion/extraction force integrated circuit socket, the first and second pivot arch shaft sections and the third driving cam are all formed on the driving section of the driving member without connecting with each other, whereby the cross-section of any two adjacent portions has greater strength.

The present invention can be best understood through the following description and accompanying drawings wherein:

BRIEF DESCRIPTION OF THE DRAWINGS

FIG. 11 is a left view of the driving member of the present invention;

FIG. 12 is a top view of the driving member of the present invention;

FIG. 13 is a right view of the driving member of the present invention;

FIG. 14 is a front view of the driving member of the present invention;

FIG. 47 is a top assembled view of the present invention, in which the operating section of the driving member is totally pressed into a horizontal state;

FIG. 48 is a right assembled view of the present invention, in which the operating section of the driving member is totally pressed into a horizontal state;

FIG. 49 is a sectional view taken along line 49—49 of FIG. 47;

DETAILED DESCRIPTION OF THE PREFERRED EMBODIMENT

Figure 1:
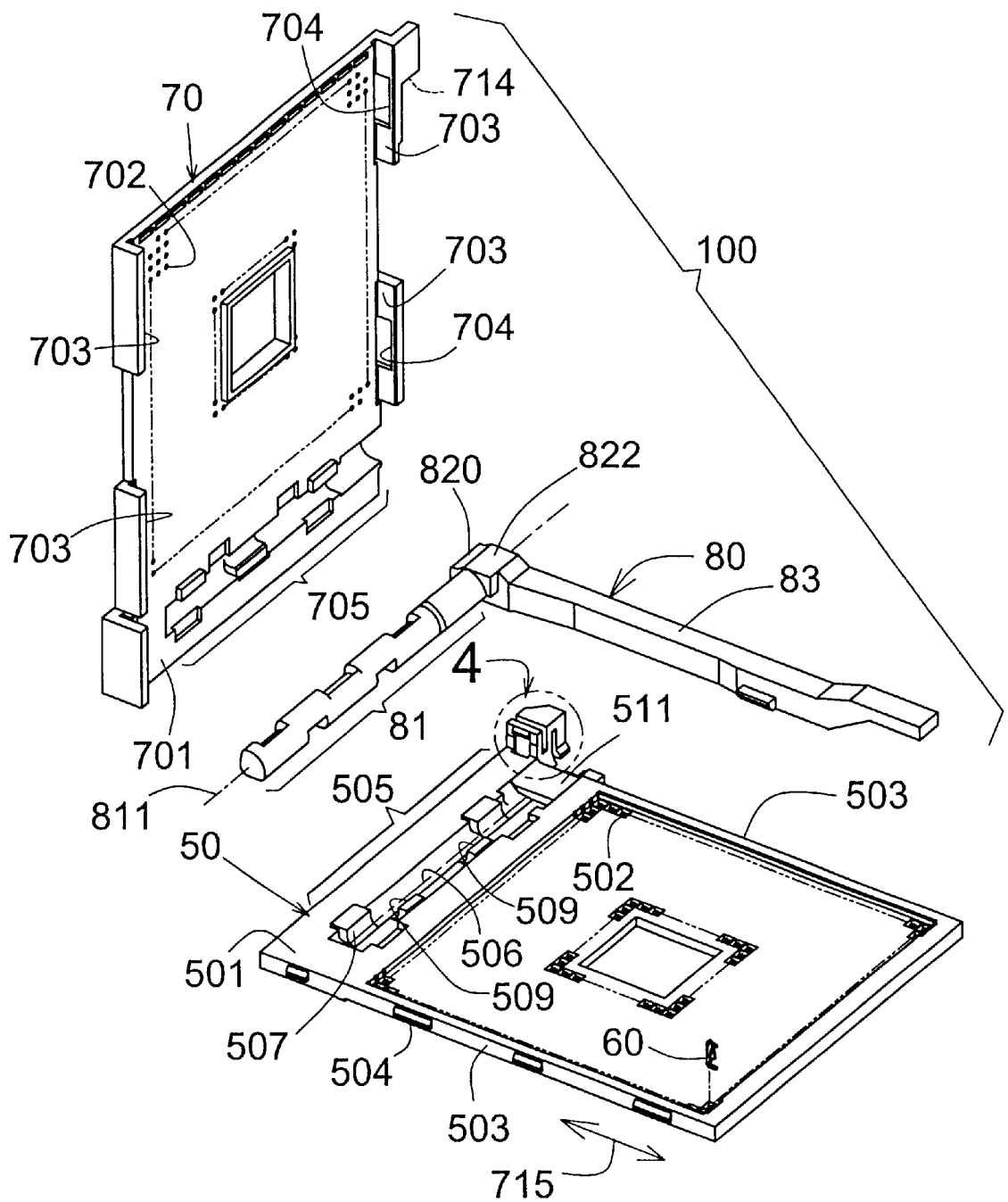
FIG. 1 is a front, left and top perspective exploded view of the present invention.
Figure 2:
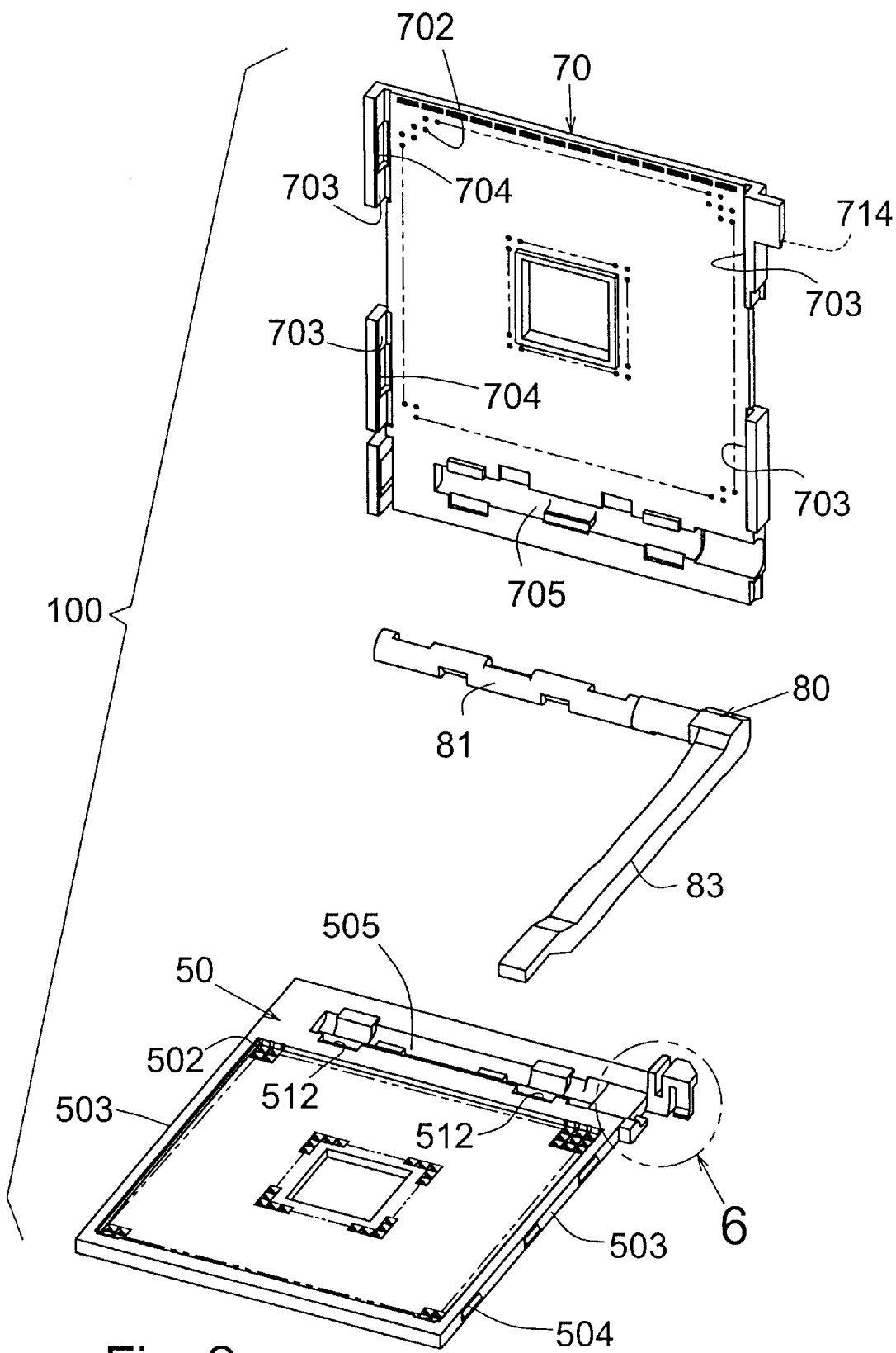
FIG. 2 is a front, right and top perspective exploded view of the present invention.
Figure 3:
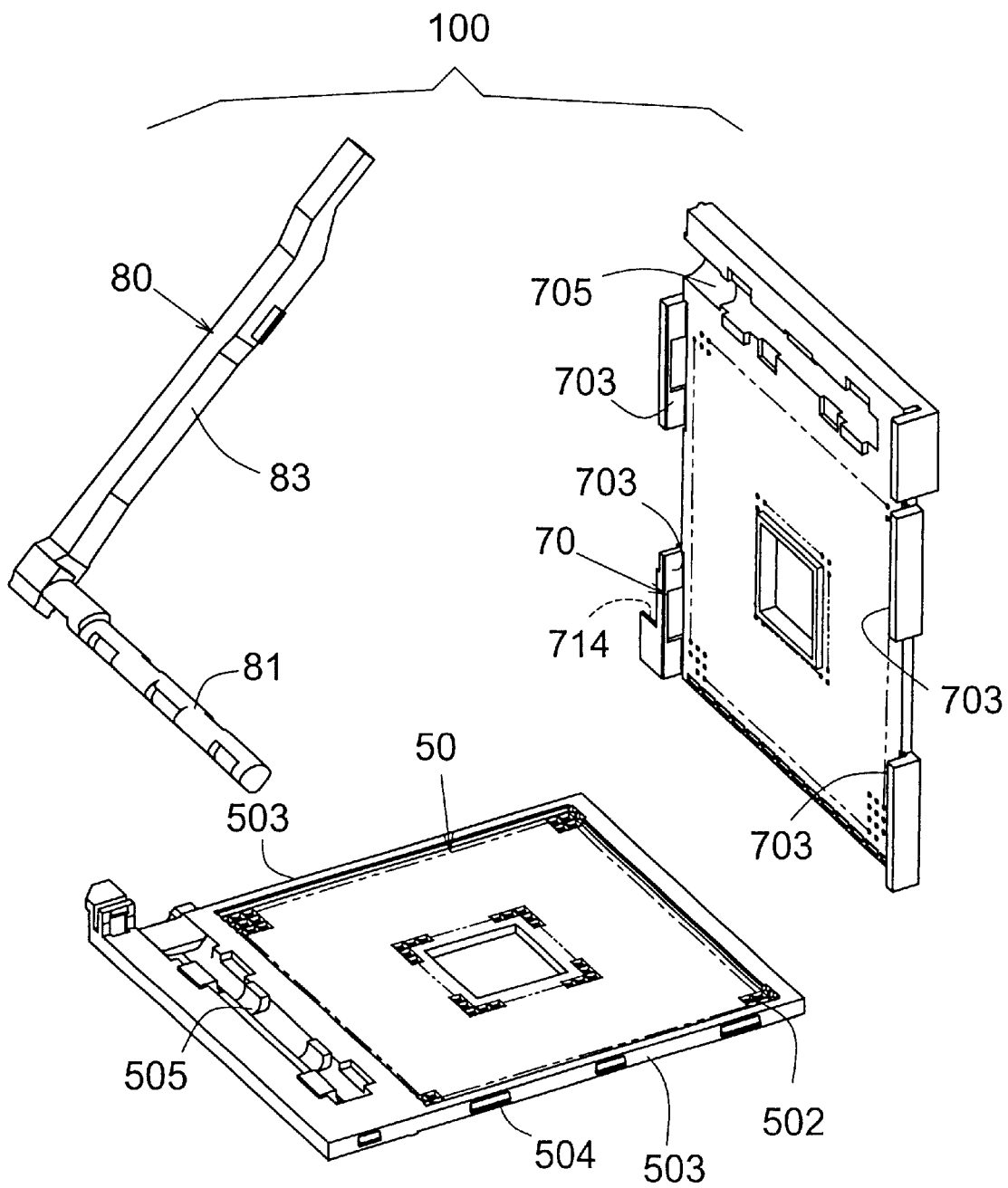
FIG. 3 is a front, left and top perspective exploded view of the present invention.
Figure 4:
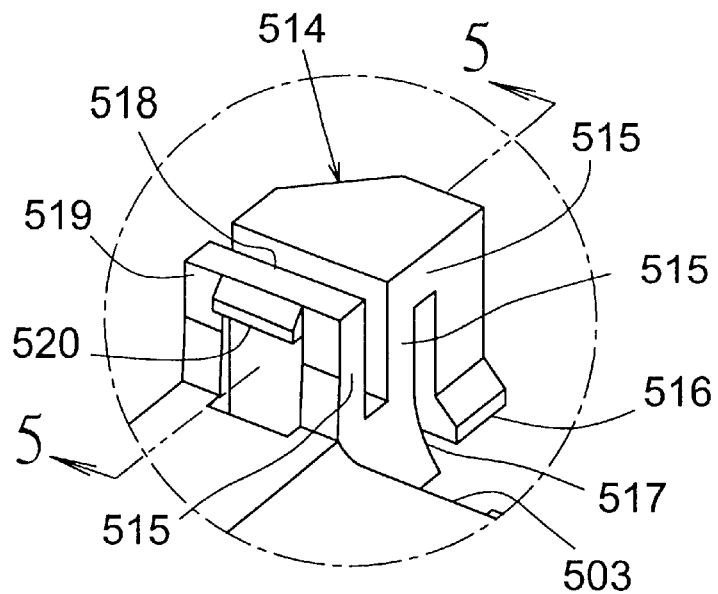
FIG. 4 is an enlarged view of encircled area 4 of FIG. 1.
Figure 5:
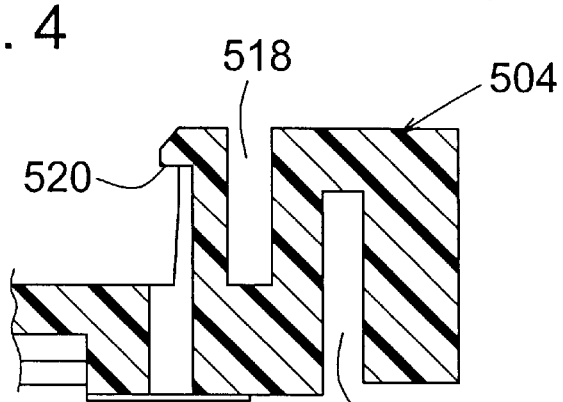
FIG. 5 is a sectional view taken along line 5—5 of FIG. 4.
Figure 6:
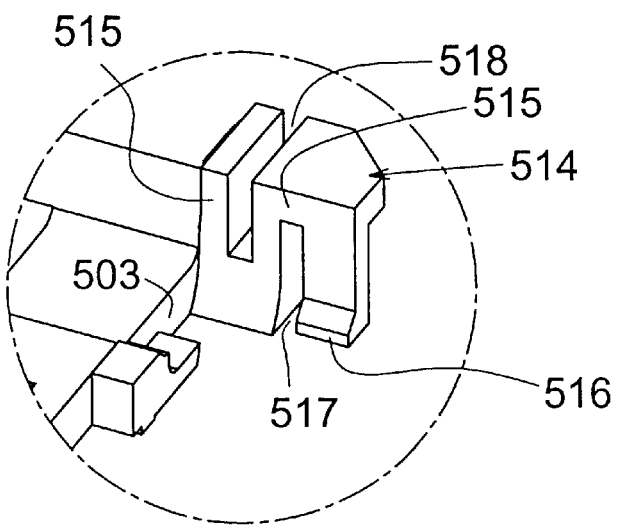
FIG. 6 is an enlarged view of encircled area 6 of FIG. 2.
Figure 7:
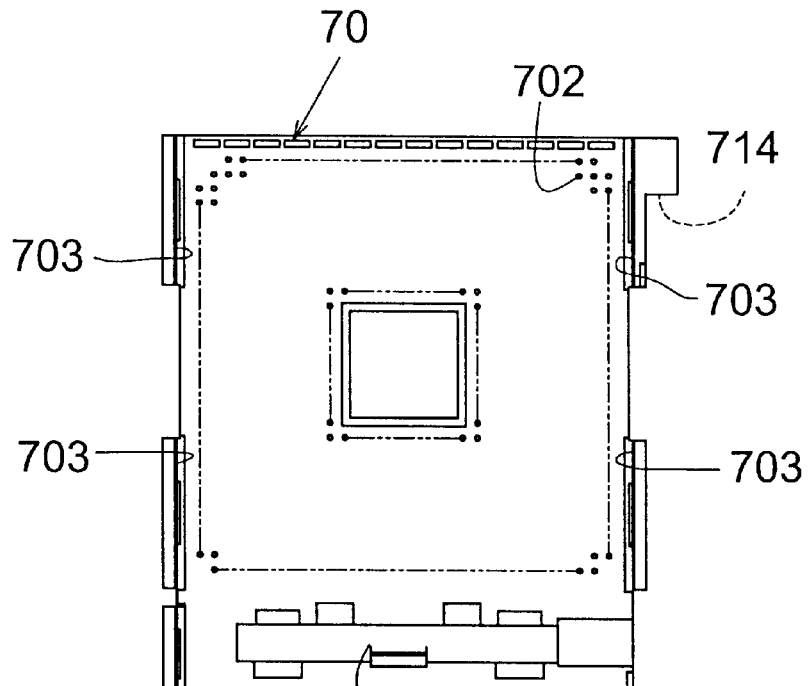
FIG. 7 is a bottom view of the slide cover of the present invention.
Figure 8:
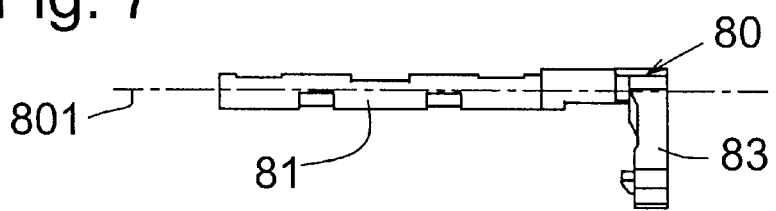
FIG. 8 is a top view of the driving member of the present invention.
Figure 9:
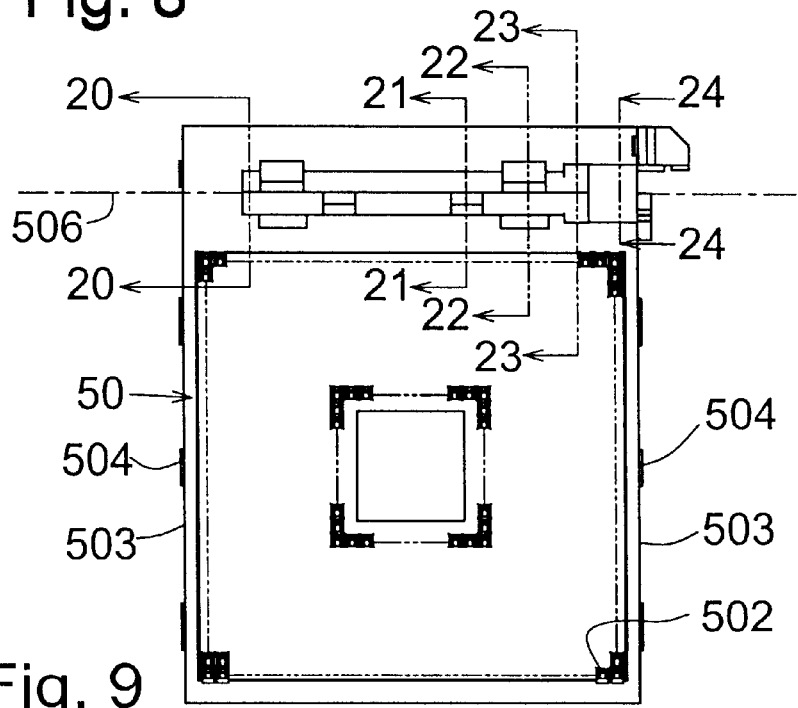
FIG. 9 is a top view of the insulating socket of the present invention.
Figure 10:
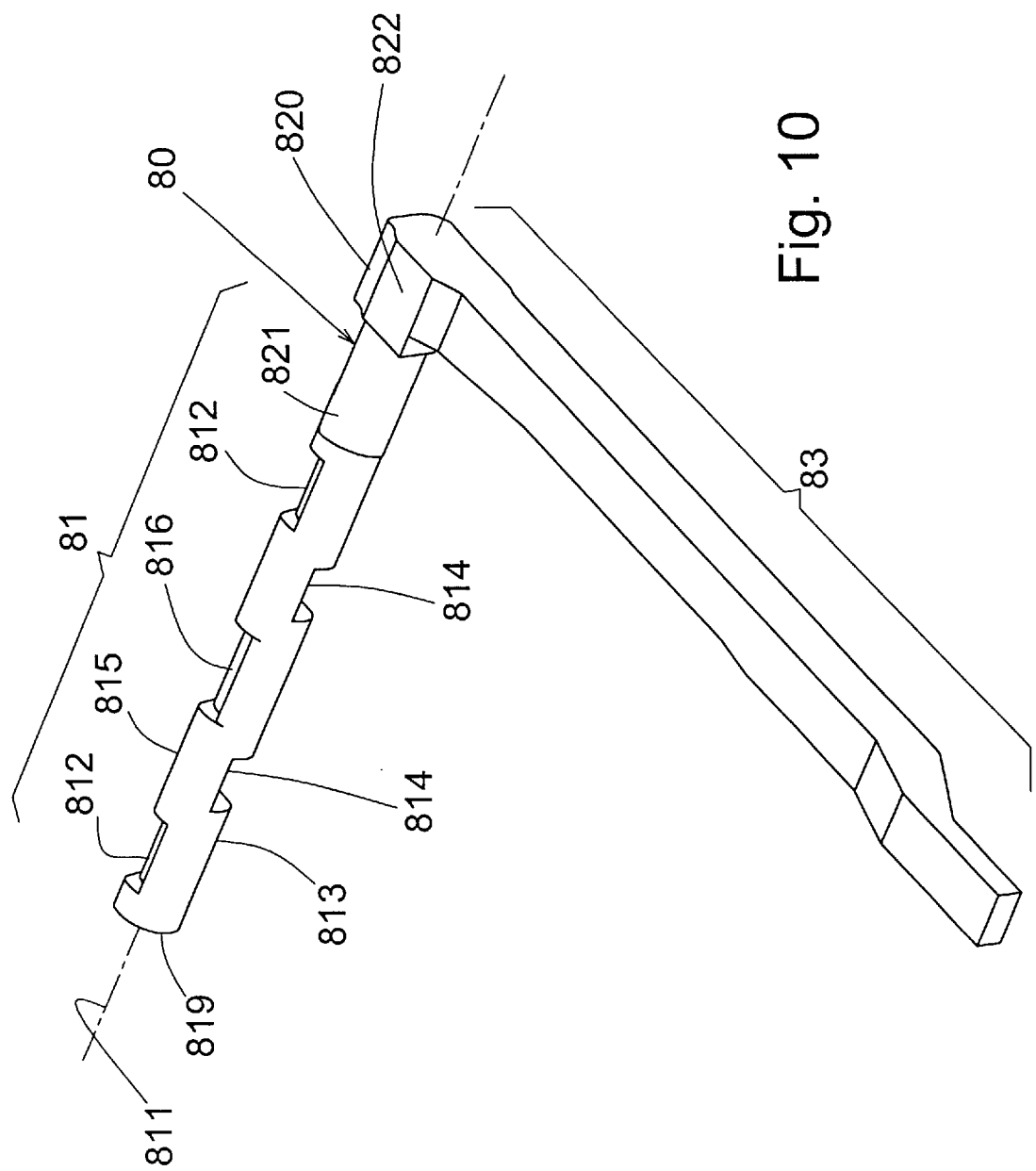
FIG. 10 is a perspective view of the driving member of the present invention.
Figure 15:
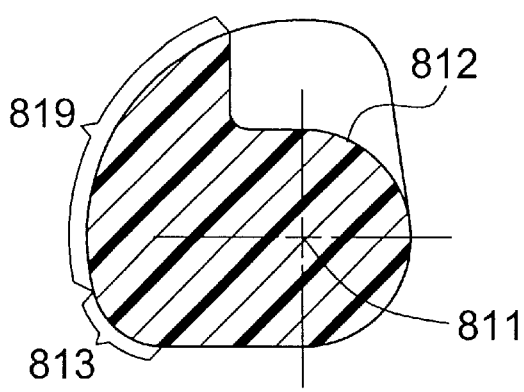
FIG. 15 is a sectional view taken along line 15—15 of FIG. 12.
Figure 16:
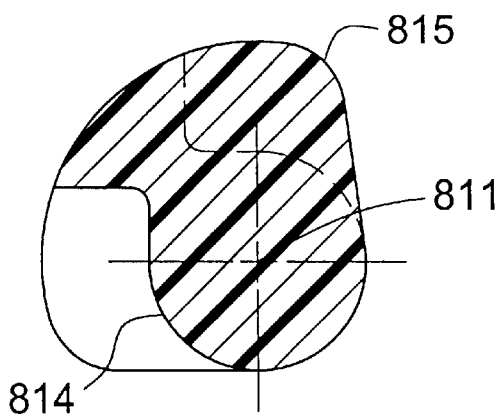
FIG. 16 is a sectional view taken along line 16—16 of FIG. 12.
Figure 18:
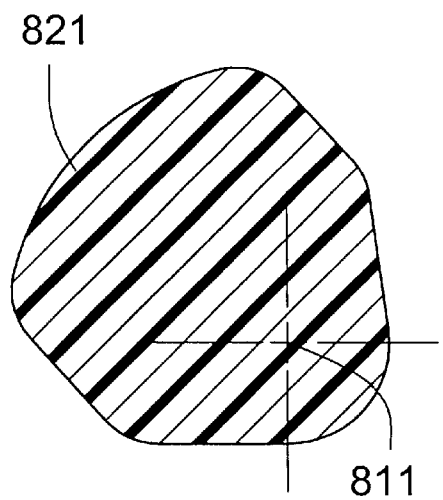
FIG. 18 is a sectional view taken along line 18—18 of FIG. 12.
Figure 17:
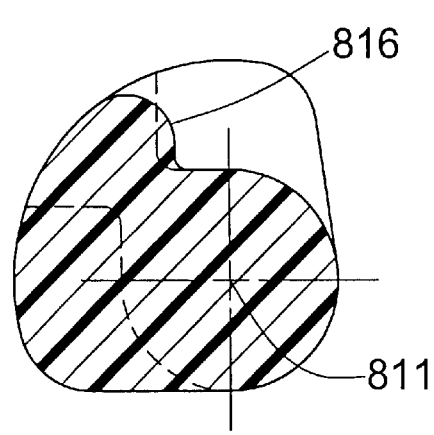
FIG. 17 is a sectional view taken along line 17—17 of FIG. 12.
Figure 19:
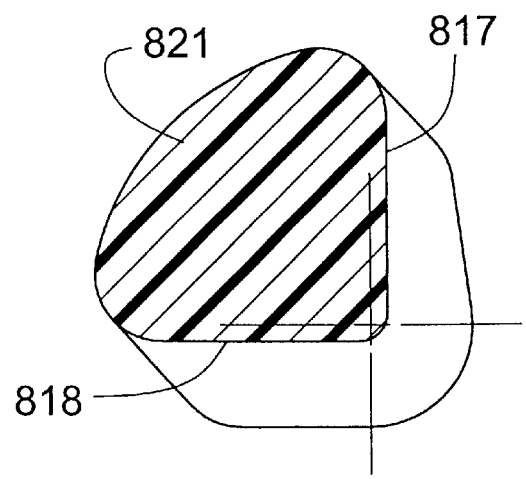
FIG. 19 is a sectional view taken along line 19—19 of FIG. 12.
Figure 20:
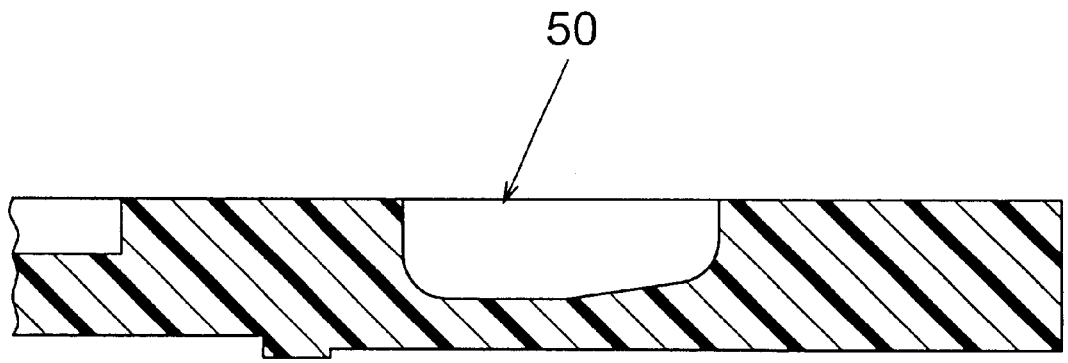
FIG. 20 is a sectional view taken along line 20—20 of FIG. 9.
Figure 21:
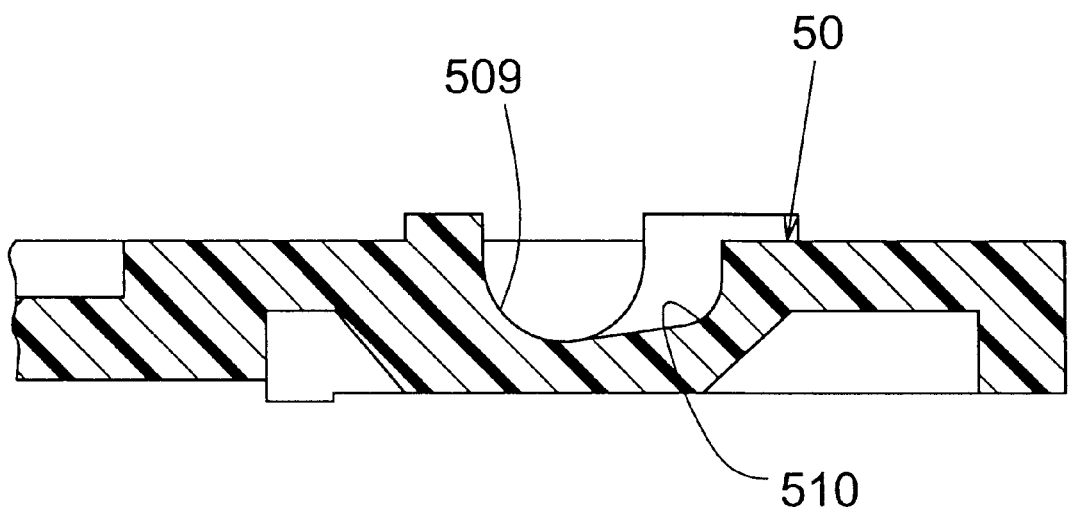
FIG. 21 is a sectional view taken along line 21—21 of FIG. 9.
Figure 22:
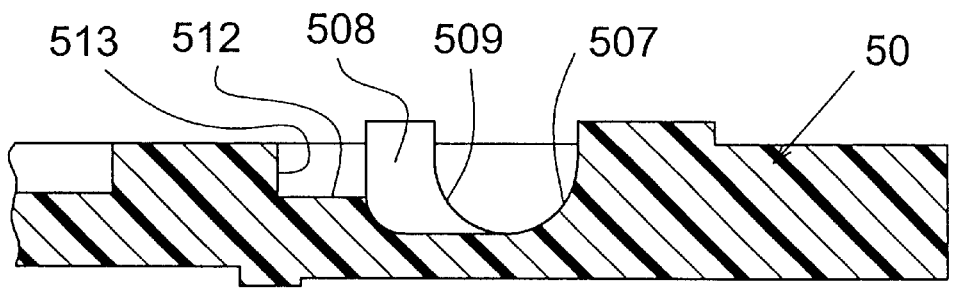
FIG. 22 is a sectional view taken along line 22—22 of FIG. 9.
Figure 23:
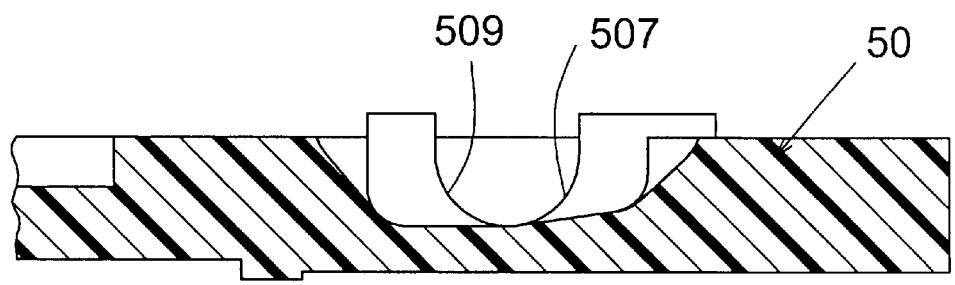
FIG. 23 is a sectional view taken along line 23—23 of FIG. 9.
Figure 24:
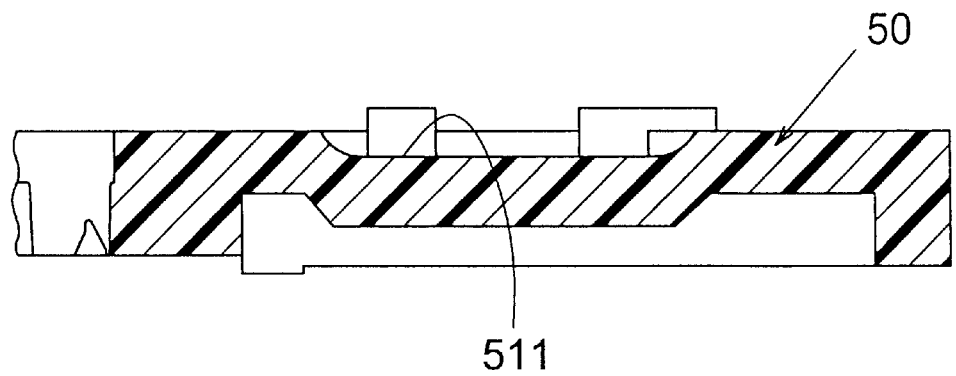
FIG. 24 is a sectional view taken along line 24—24 of FIG. 9.
Figure 25:
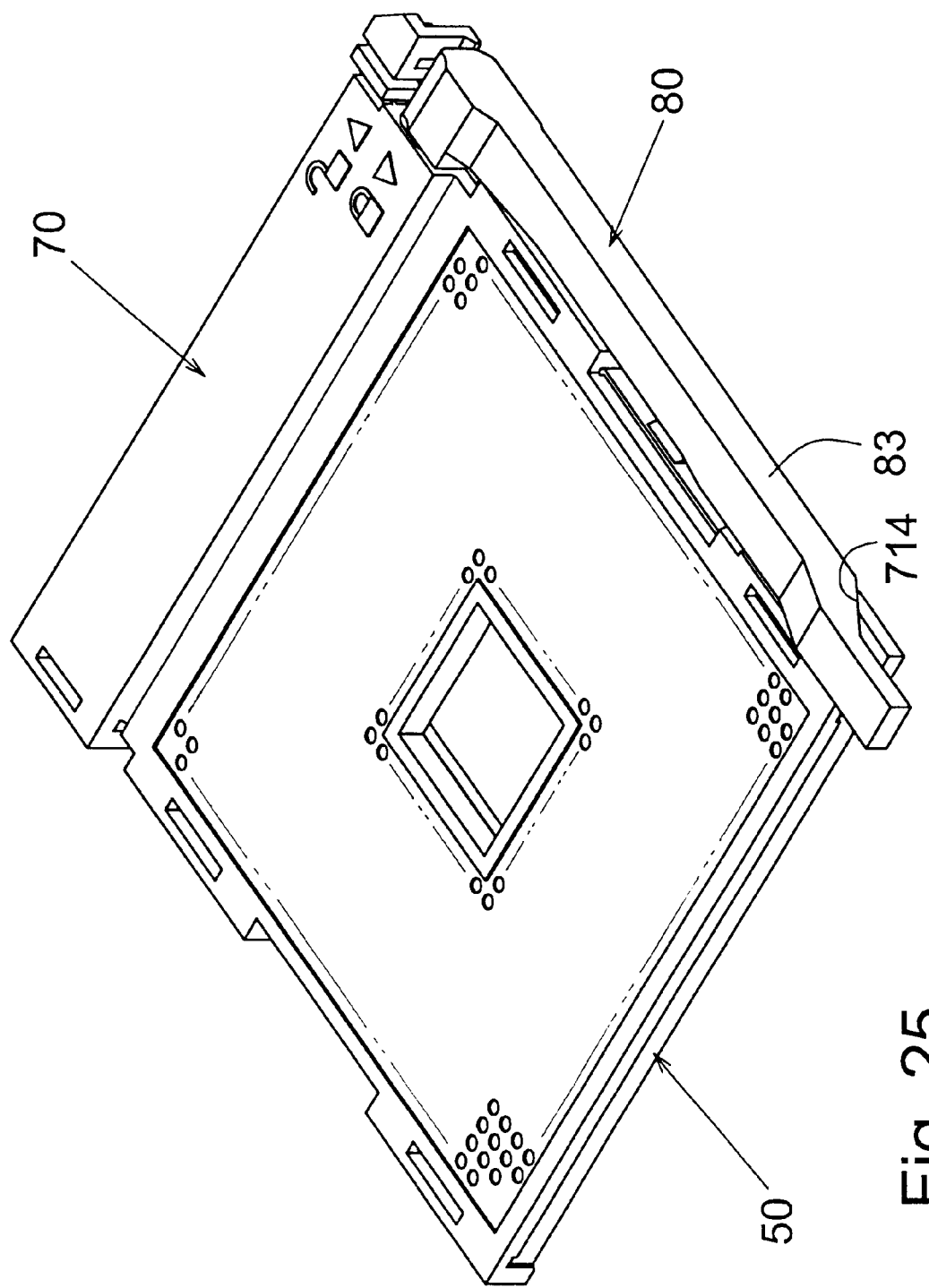
FIG. 25 is a front, right and top perspective assembled view of the present invention.
Figure 55:
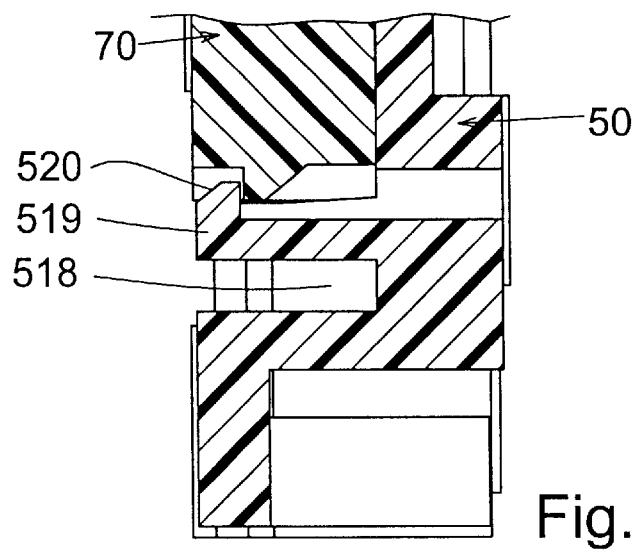
FIG. 55 is an enlarged view of encircled area 55 of FIG. 49.

Please refer to FIGS. 1 to 55. The zero insertion/extraction force integrated circuit socket 100 of the present invention includes an insulating socket 50, multiple conductive members 60, a slide cover 70 and a driving member 80.

The insulating socket 50 has a first slide connecting face 501, multiple insertion holes 502 and a first receiving section 505.

The first slide connecting face 501 is positioned on one face of the insulating socket 50. The multiple insertion holes 502 are arranged on the first slide connecting face 501 and pass through the insulating socket 50. Two first guiding edges 503 are respectively disposed on two opposite edges of the insulating socket 50. Each of the guiding edges 503 has a first latch section 504 projecting therefrom.

The first receiving section 505 is formed on one side of the insulating socket 50 and communicates with the first slide connecting face 501. The first receiving section 505 has a first pivot arch recess 507, a first receiving dent 508, a second pivot arch recess 509 and a second receiving dent 510.

A first axis 506 serves as the arch center of the first pivot arch recess 507. The first receiving dent 508 is connected with the first pivot arch recess 507. The first axis 506 also serves as the arch center of the second pivot arch recess 509. The second and first pivot arch recesses 509, 507 together form a U-shaped pivot section. The second receiving dent 510 is connected with the second pivot arch recess 509.

The multiple conductive members 60 are inserted in the insertion holes 502 of the insulating socket 50 one to one. The conductive members 60 pass through the insertion holes 502 to electrically contact with the circuit board.

The slide cover 70 has a second slide connecting face 701, multiple through holes 702, two second guiding edges 703 and a second receiving section 705.

The second slide connecting face 701 is positioned on one face of the slide cover 70 to slidably contact with the first slide connecting face 501 of the insulating socket 50. The direction in which the slide cover 70 moves relative to the insulating socket 50 is defined as sliding path. Multiple through holes 702 are arranged on the second slide connecting face 701 of the slide cover 70 and pass through the slide cover 70. Multiple insertion pins of an integrated circuit are inserted through the through holes 702 into the insertion holes 502 of the insulating socket 50. The two second guiding edges 703 are respectively disposed on two opposite edges of the slide cover. Each guiding edge has a second latch section 704. The second latch section 704 is slidably latched with the first latch section 504 of the insulating socket 50. Accordingly, the first and second guiding edges 503, 703 and the first and second slide connecting faces 501, 701 together guide the slide cover 70 to slide relative to the insulating socket 50.

The second receiving section 705 is formed on one side of the slide cover 70. The second receiving section 705 and the first receiving section 505 of the insulating socket 50 are mated to form a receiving cavity.

The second receiving section 705 has a first receiving dent 706, a second receiving dent 708 and a third receiving dent 710.

The first receiving dent 706 has a first driven face 707 not parallel to the second slide connecting face 701. The second receiving dent 708 has a second driven face 709 not parallel to the second slide connecting face 701. The third receiving dent 710 has a third driven face 711 not parallel to the second slide connecting face 701.

The driving member 80 has a driving section 81 and an operating section 83. The driving section 81 is hidden in the receiving cavity formed by the first receiving section 505 of the insulating socket 50 and the second receiving section 705 of the slide cover 70. The driving section 81 is pivotally rotatable about the first axis 506 of the receiving cavity relative to the insulating socket 50 and the slide cover 70.

The driving section 81 has a second axis 811, a first pivot arch shaft section 812, a first driving cam 813, a second pivot arch shaft section 814, a second driving cam 815 and a third driving cam 816.

The second axis 811 coincides with the first axis 506 of the first receiving section 505 of the insulating socket 50. The second axis 811 serves as the arch center of the first pivot arch shaft section 812. The first pivot arch shaft section 812 is pivotally connected with the first pivot arch recess 507 of the first receiving section 505. The first driving cam 813 is radially connected with one side of the first pivot arch shaft section 812. The first driving cam 813 slidably contacts with the first driven face 707 of the slide cover 70 for driving the slide cover 70 to slide to a contact position 70' where the insertion pins of the integrated circuit fully contact with the conductive members. The second axis 811 also serves as the arch center of the second pivot arch shaft section 814. The second pivot arch shaft section 814 is pivotally connected with the second pivot arch recess 509 of the first receiving section 505 of the insulating socket 50. The second driving cam 815 is radially connected with one side of the second pivot arch shaft section 814. The second driving cam 815 slidably contacts with the second driven face 709 of the slide cover 70 for driving the slide cover 70 to slide through a first separation travel of the travel from the contact position 70' to a separation position 70" where the insertion pins of the integrated circuit fully separate from the conductive members. The second driving cam 815 is radially spaced from the first driving cam 813 by a first arch angle. The third driving cam 816 slidably contacts with the third driven face 711 of the slide cover 70 for driving the slide cover 70 to slide through a second separation travel of the travel from the contact position 70' to the separation position 70" where the insertion pins of the integrated circuit fully separate from the conductive members. The third driving cam 816 is spaced from the first driving cam 813 by a second arch angle which is smaller than the first arch angle.

The operating section 83 is perpendicularly integrally connected with one end of the driving section 81 and exposed to outer side of the insulating socket 50 and the slide cover 70. By means of shifting the operating section 83, the driving member 80 is rotated about the first axis 506, whereby the second driving cam 815 and third driving cam 816 of the driving member 80 drive the slide cover 70 to slide to the separation position 70" where the insertion pins of the integrated circuit fully separate from the conductive members. At this time, the position where the driving member 80 is positioned is defined as a first position. The first driving cam 813 of the driving member 80 serves to drive the slide cover 70 to slide from the separation position 70" to the contact position 70' where the insertion pins of the integrated circuit just filly contact with the conductive members. At this time, the position where the driving member 80 is positioned is defined as a second position. In the second position, the operating section 83 of the driving member 80 has not yet attached to the locating section 714 of the slide cover 70. When the operating section 83 of the driving member 80 fully attaches to the locating section 714 of the slide cover 70, the position where the driving member 80 is positioned is defined as a third position.

The slide cover 70 further includes a projecting section 713 projecting from the second slide connecting face 701. The projecting section 713 is positioned between the second receiving section 705 and the through hole 702 and adjacent to one side of the second receiving section 705. The first driven face 707 extends to one lateral face of the projecting section 713. The other lateral face of the projecting section 713 serves as a first stop face 712.

The insulating socket 50 further has a dent 512 formed on the insulating socket 50 between the first receiving section 505 and the insertion hole 502. In addition, the dent 512 is adjacent to and communicates with one side of the first receiving section 505. The dent 512 communicates with the first slide connecting face 501 and corresponds to the projecting section 713 of the slide cover 70 for receiving the projecting section 713. A face of the dent 512 corresponding to the first stop face 712 of the projecting section 713 serves as a second stop face 513. When the slide cover 70 reaches the contact position 71', the first stop face 712 contacts with the second stop face 513 of the insulating socket 50.

The driving member 80 further has a first arched face 819 which is radially connected with the first driving cam 813.

The axis of the curvature center of the first arch face 819 coincides with the second axis 811 of the driving member 80. The distances from every parts of the first arched face 819 to the second axis 811 are not smaller than the distances from every parts of the first driving cam 813 to the second axis 811. When the driving member 80 reaches the second position, the first driving cam 813 of the driving member 80 keeps contacting with the first driven face 707 of the slide cover 70. In this travel, the driving member 80 is positioned in the first position or the second position or is positioned between the first and second positions. When the driving member 80 is positioned between the second and third positions, the first arched face 819 always keeps contacting with the first driven face 707 of the slide cover 70. In this travel, the distances from the first arched face 819 to the second axis 811 are equal so that the slide cover 70 always stably keeps in the contact position.

The first arched face 819, first pivot arch shaft section 812 and second pivot arch shaft section 814 of the driving member 80 are rotatably engaged in the first pivot arch recess 507, second pivot arch recess 509 of the insulating socket 50 and the first receiving dent 706 and second receiving dent 708 of the slide cover 70. Accordingly, the driving member 80 is pivotally disposed in the first and second pivot arch recesses 507, 509 of the insulating socket 50 and the slide cover 70.

A locating projecting section 514 is disposed in a position where the first guiding edge 503 and the first receiving section 505 of the insulating socket 50 intersect each other. The locating projecting section 514 has a locating wall 515. A rear end of the locating wall 515 is formed with a resilient latch section 516. A first split 517 is formed on the locating projecting section 514 near the first guiding edge 503 in parallel thereto, whereby the locating wall 515 of the locating projecting section 514 has a rigidity, while the resilient latch section 516 of the locating projecting section 514 has a resilience in a direction along the first split 517.

A second split 518 is formed on the locating projecting section 514 near the first guiding edge 503 in parallel thereto, whereby the locating projecting section 514 further has a resilient section 519. A latch tenon 520 is formed on inner side of the resilient section 519 of the locating projecting section 514 for slidably latching with the slide cover 70.

A portion of the operating section 83 of the driving member 80 near the driving section 81 is further formed with: a locating section 822, when the driving member 80 is positioned in the first position, the locating section 822 contacting with the locating wall 515 of the insulating socket 50; and a locating latch section 820 formed at rear end of the locating section 822. The locating latch section 820 is not positioned on the second axis 811. The driving member 80 is rotated to latch the locating latch section 820 with the resilient latch section 516 of the insulating socket 50, whereby the operating section 83 of the driving member 50 is kept in a position erect from the insulating socket 50.

In the zero insertion/extraction force integrated circuit socket 100 of the present invention, the driving member 80 has two first pivot arch shaft sections 812 and two second pivot arch shaft sections 814 which are not connected with each other.

Alternatively, in the zero insertion/extraction force integrated circuit socket 100 of the present invention, the driving member 80 has multiple first pivot arch shaft sections 812 and multiple second pivot arch shaft sections 814 which are not connected with each other.

In the zero insertion/extraction force integrated circuit socket 100 of the present invention, the number and position of the first pivot arch recess 507 and second pivot arch recess 509 of the insulating socket 50 respectively correspond to the number and position of the first pivot arch shaft sections 812 and second pivot arch shaft sections 814.

In the zero insertion/extraction force integrated circuit socket 100 of the present invention, a reinforcing section 511 is further formed in a communicating portion between the first receiving section 505 and the first slide connecting face 501 of the insulating socket 50. The thickness from the reinforcing section 511 to the bottom face of the insulating socket 50 is larger than the thickness from the first receiving section 505 to the bottom face of the insulating socket 50.

The driving member 80 further has: a first recess 817; a second recess 818, when the driving member 80 is positioned in the first position and the third position, the first and second recesses 817, 818 respectively corresponding to the reinforcing section 511 of the insulating socket 50; and a reinforcing section 821 bridged between the first and second recesses 817, 818 to compensate the thickness of the cross-section of the first and second recesses 817, 818 so as to enhance the strength of the driving section 81 of the driving member 80.

In the zero insertion/extraction force integrated circuit socket 100 of the present invention, the first and second pivot arch shaft sections 812, 814 and the third driving cam 816 are all formed on the driving section 81 of the driving member 80 without connecting with each other. Therefore, the cross-section of any two adjacent portions has greater strength.

Figure 26:
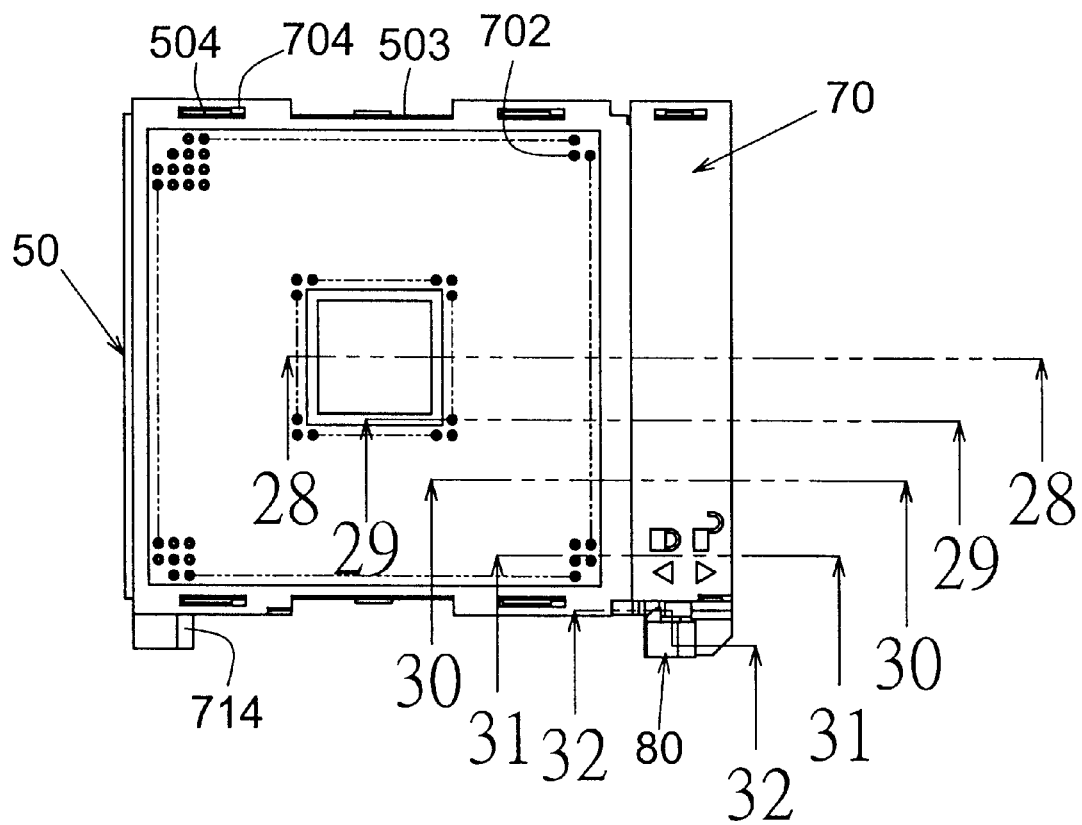
FIG. 26 is a top assembled view of the present invention, in which the operating section of the driving member is in an erect state.
Figure 27:
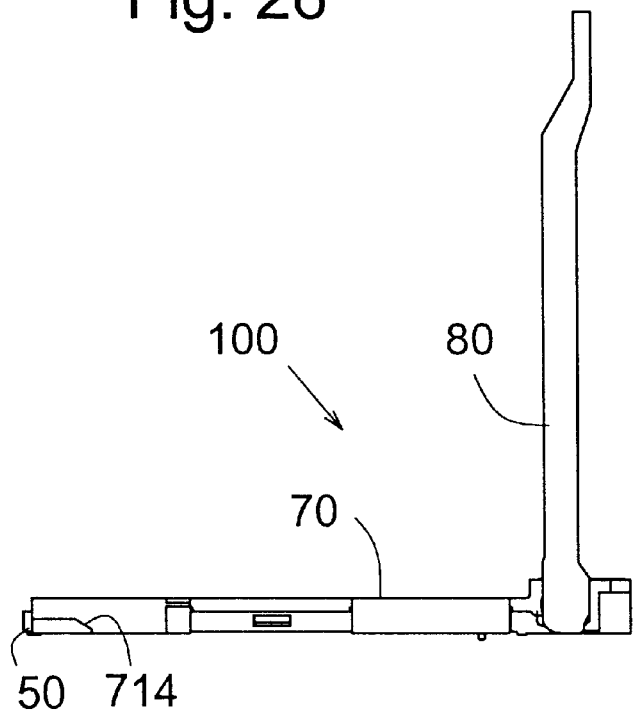
FIG. 27 is a right assembled view of the present invention, in which the operating section of the driving member is in an erect state.
Figure 28:
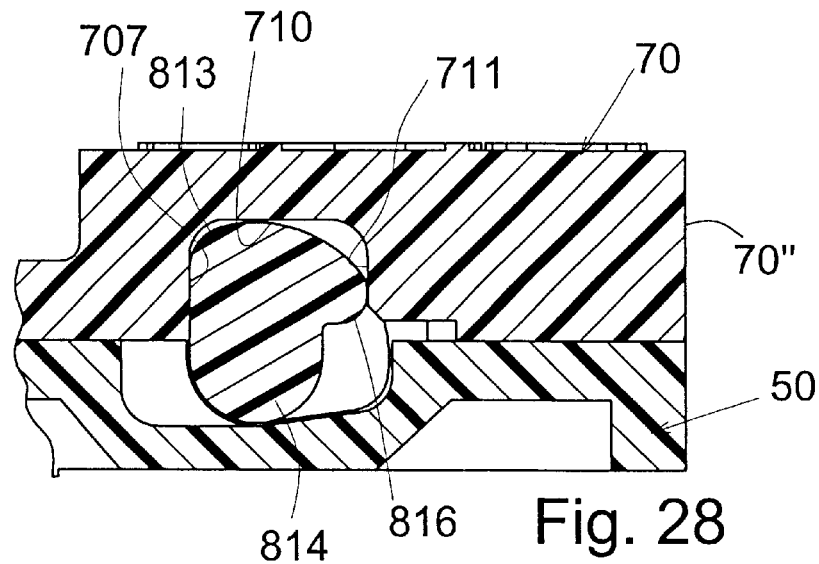
FIG. 28 is a sectional view taken along line 28—28 of FIG. 26.
Figure 29:
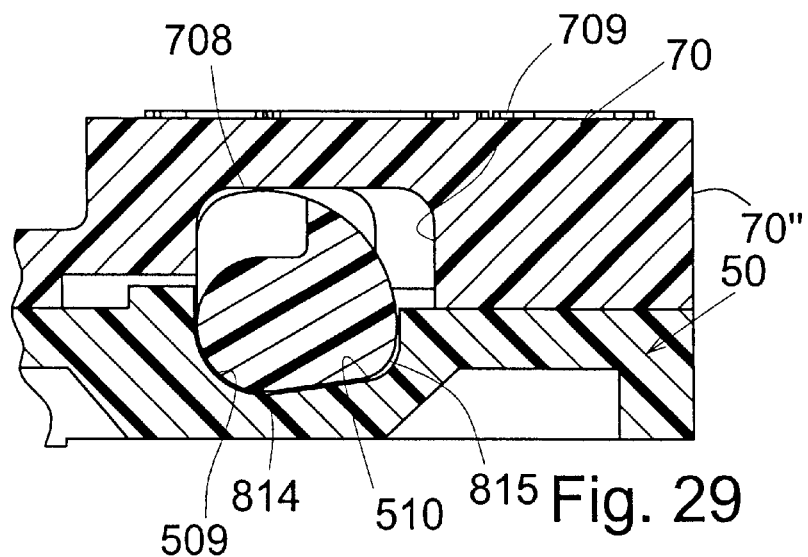
FIG. 29 is a sectional view taken along line 29—29 of FIG. 26.
Figure 30:
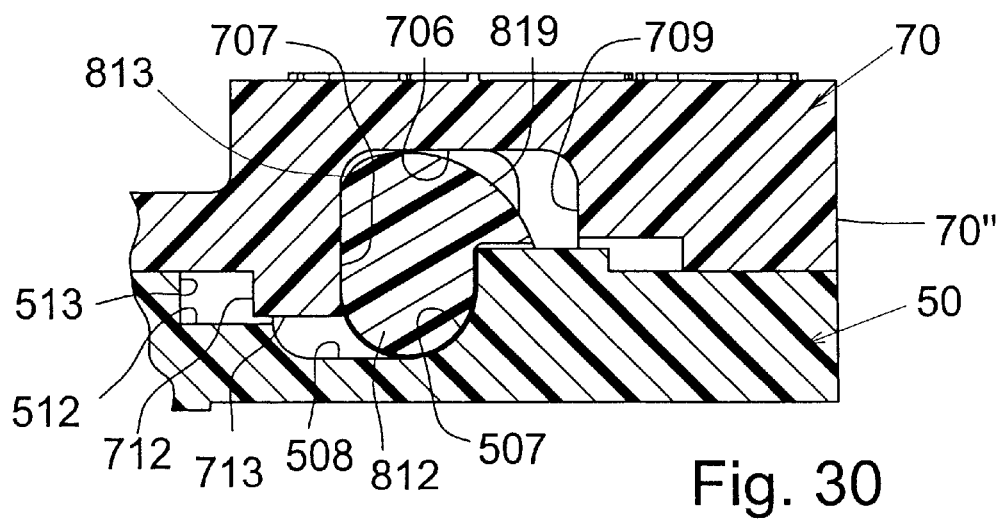
FIG. 30 is a sectional view taken along line 30—30 of FIG. 26.
Figure 31:
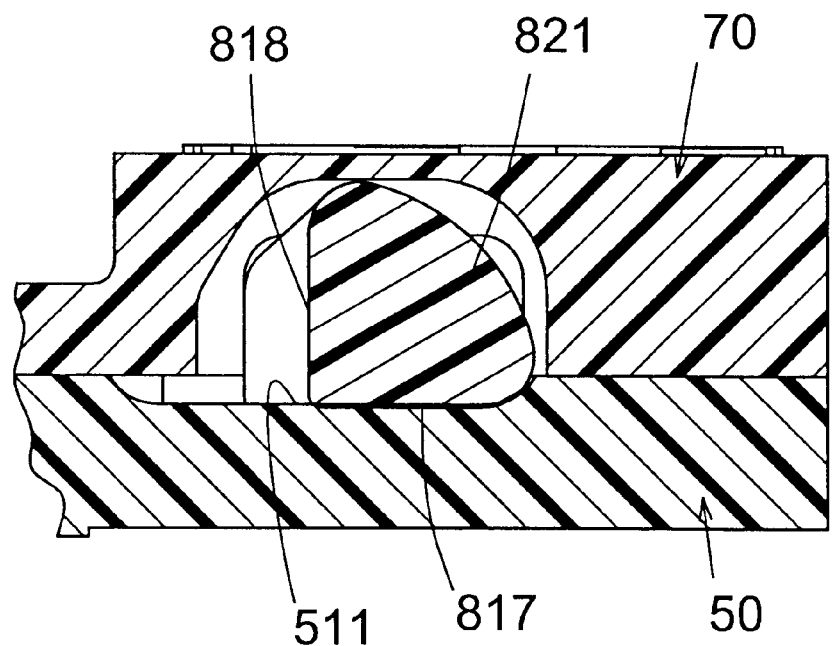
FIG. 31 is a sectional view taken along line 31—31 of FIG. 26.
Figure 32:
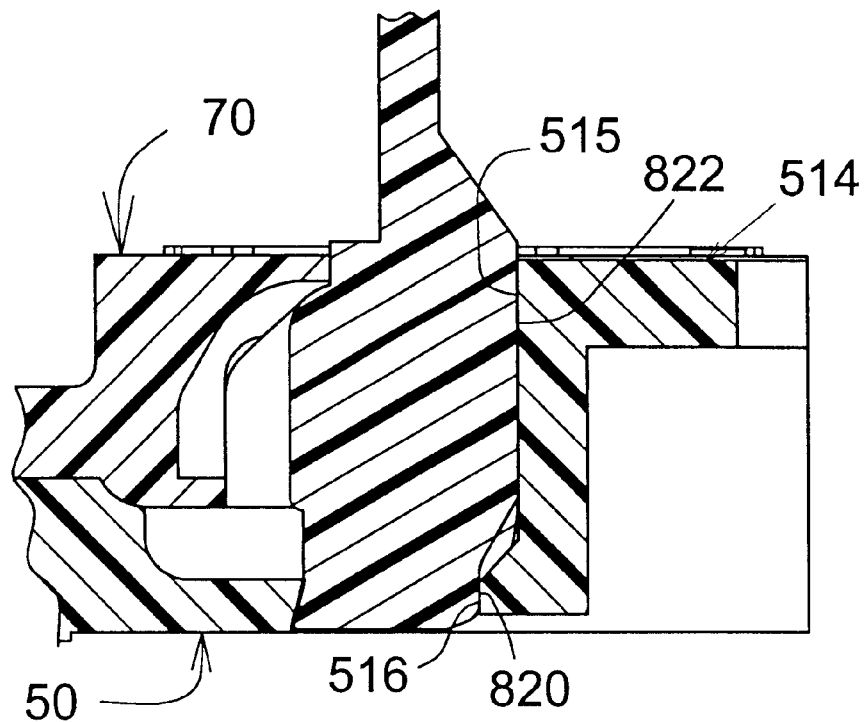
FIG. 32 is a sectional view taken along line 32—32 of FIG. 26.

In operation, referring to FIGS. 26 and 27, the operating section 83 of the driving member 80 is in an erect state. At this time, the third driving cam 816 is placed in a state as shown in FIG. 28, the second driving cam 815 is placed in a state as shown in FIG. 29 and the first driving cam 813 is placed in a state as shown in FIG. 30. The third driving cam 816 in the state of FIG. 28 will rightward push the third driven face 711 of the slide cover 70 to a rightmost position, that is, a position where the right edge of the slide cover 70 is aligned with the right edge of the insulating socket 50, whereby the slide cover 70 reaches the separation position 70". At the same time, as shown in FIG. 32, the locating section 822 of the operating section 83 of the driving member 80 attaches to the locating wall 515 of the insulating socket 50 with the locating latch section 820 just latched with the resilient latch section 516 of the insulating socket 50. Under such circumstance, the operating section 83 is prevented from unexpectedly counterclockwise falling down. At this time, the through hole 702 of the slide cover 70 is right aligned with the insertion section (not shown) of the conductive member 60 so that the insertion pin of the integrated circuit (not shown) can be easily inserted into the integrated circuit socket 100 (with zero insertion force) or extracted out of the socket 100 (with zero extraction force).

Figure 33:
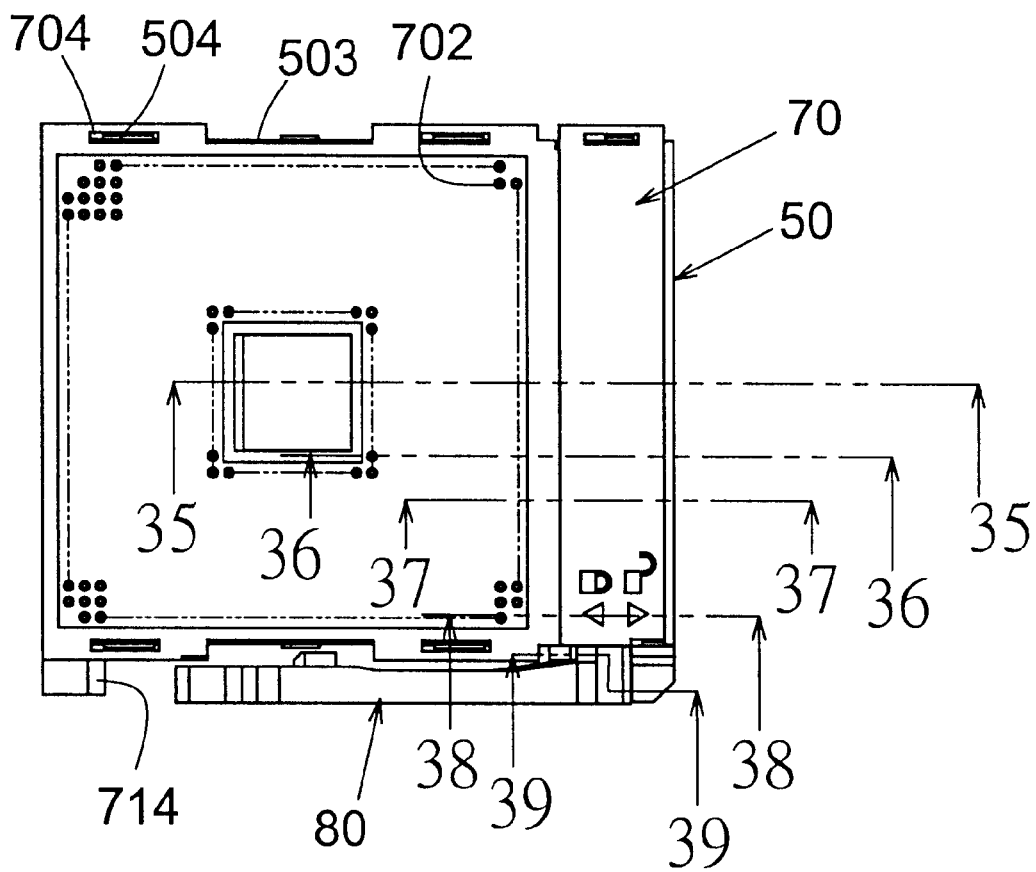
FIG. 33 is a top assembled view of the present invention, in which the operating section of the driving member is 45 degrees inclined.
Figure 34:
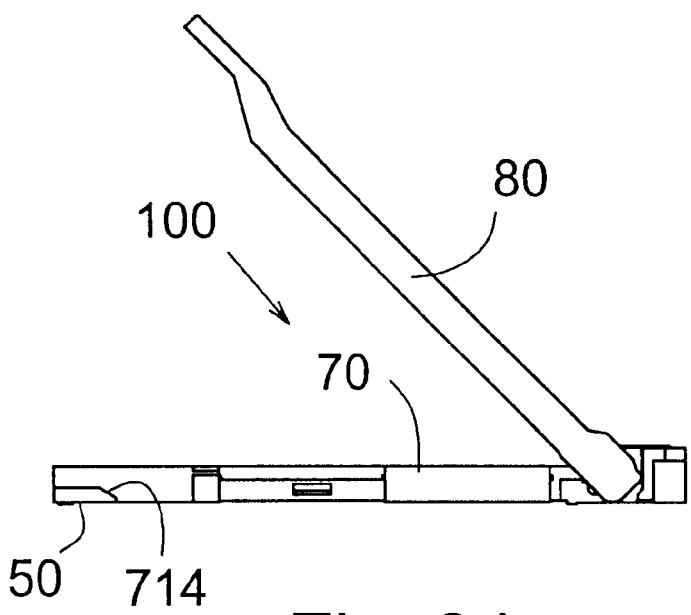
FIG. 34 is a right assembled view of the present invention, in which the operating section of the driving member is 45 degrees inclined.
Figure 35:
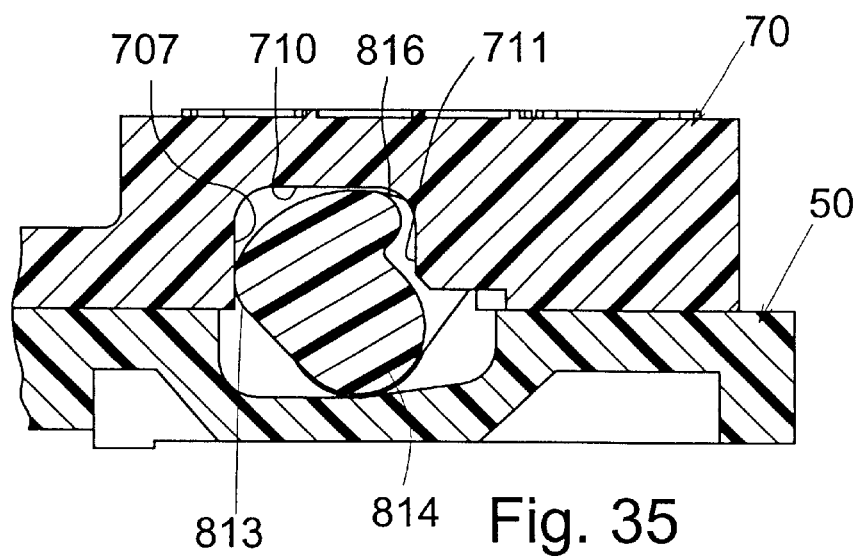
FIG. 35 is a sectional view taken along line 35—35 of FIG. 33.
Figure 37:
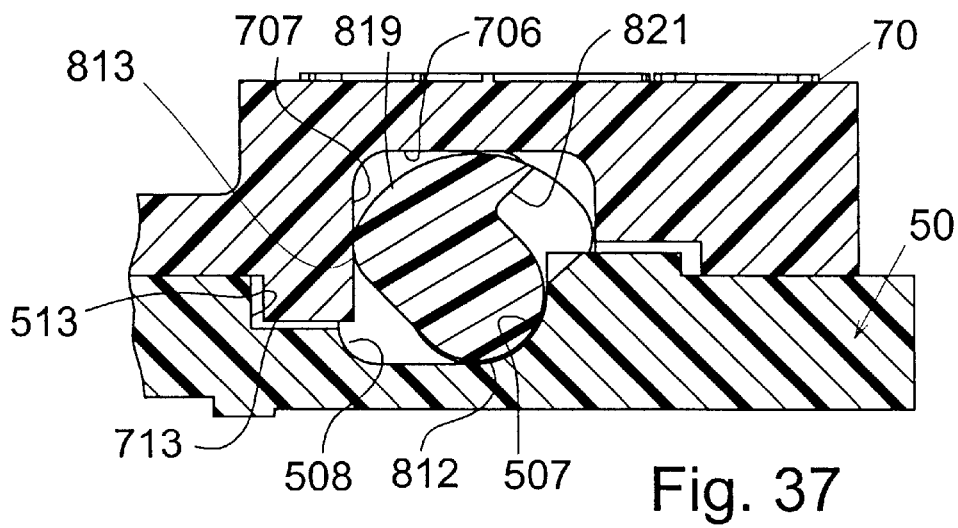
FIG. 37 is a sectional view taken along line 37—37 of FIG. 33.
Figure 38:
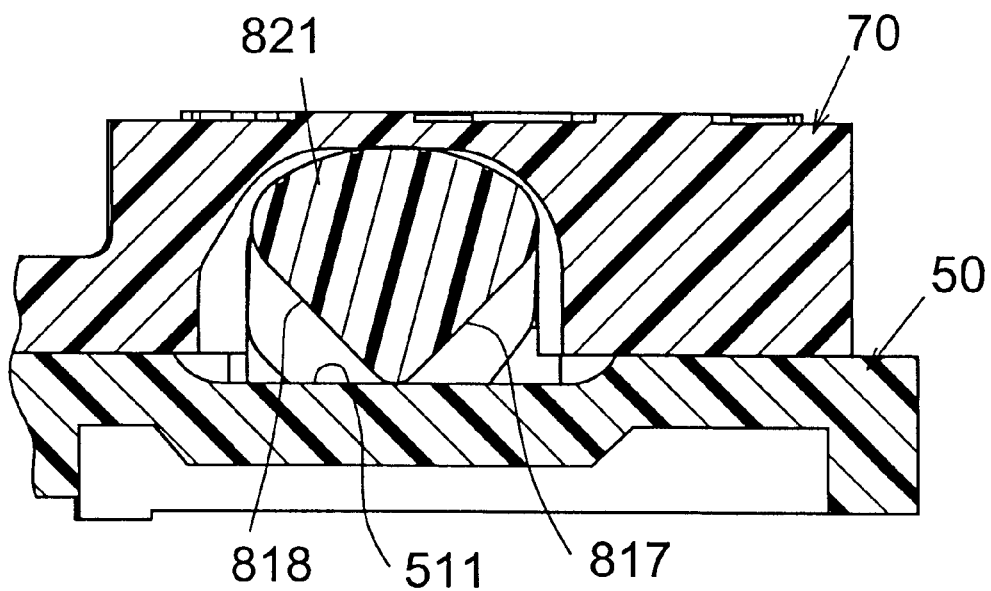
FIG. 38 is a sectional view taken along line 38—38 of FIG. 33.
Figure 39:
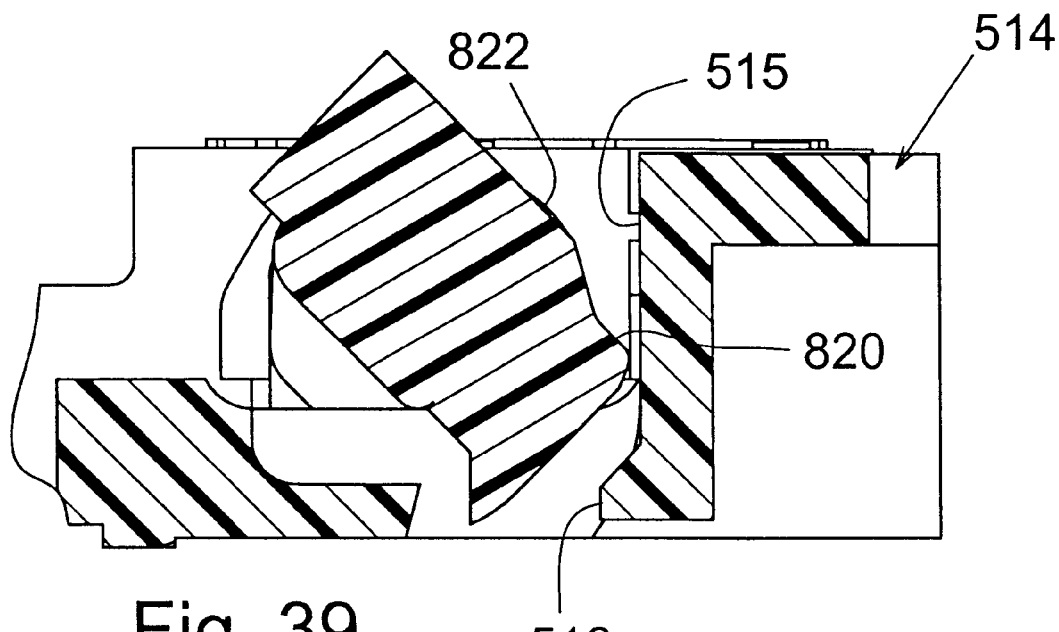
FIG. 39 is a sectional view taken along line 39—39 of FIG. 33.

Referring to FIGS. 33 and 34, after the insertion pin of the integrated circuit (not shown) is easily inserted into the insertion section (not shown) of the conductive member 60 of the integrated circuit socket 100, the operating section 83 of the driving member 80 is slightly forced to counterclockwise rotate as shown in FIG. 38. At this time, the locating latch section 820 of the operating section 83 is unlatched from the resilient latch section 516 of the insulating socket 50. Referring to FIG. 37, the first driving cam 813 pushes the first driven face 707 of the slide cover 70 to make the slide cover 70 leftward slide from the separation position 70" of FIG. 30.

Figure 40:
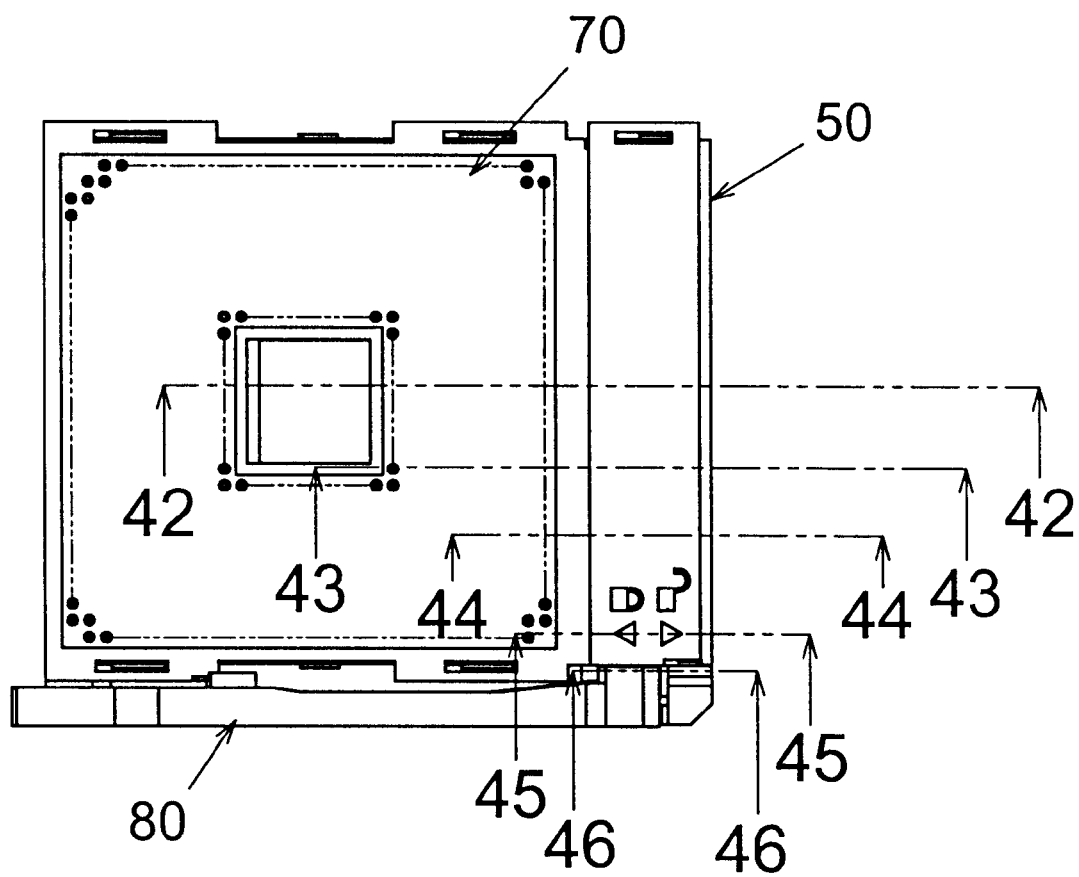
FIG. 40 is a top assembled view of the present invention, in which the operating section of the driving member is about to be pressed into a horizontal state.
Figure 41:
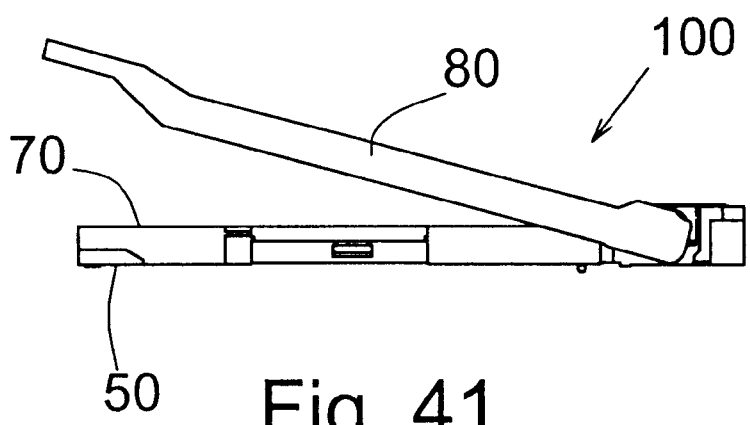
FIG. 41 is a right assembled view of the present invention, in which the operating section of the driving member is about to be pressed into a horizontal state.
Figure 42:
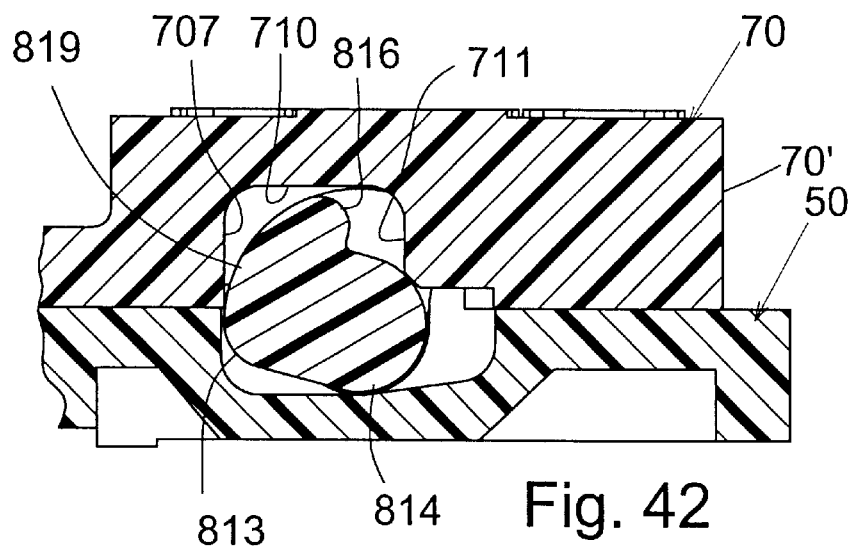
FIG. 42 is a sectional view taken along line 42—42 of FIG. 40.
Figure 43:
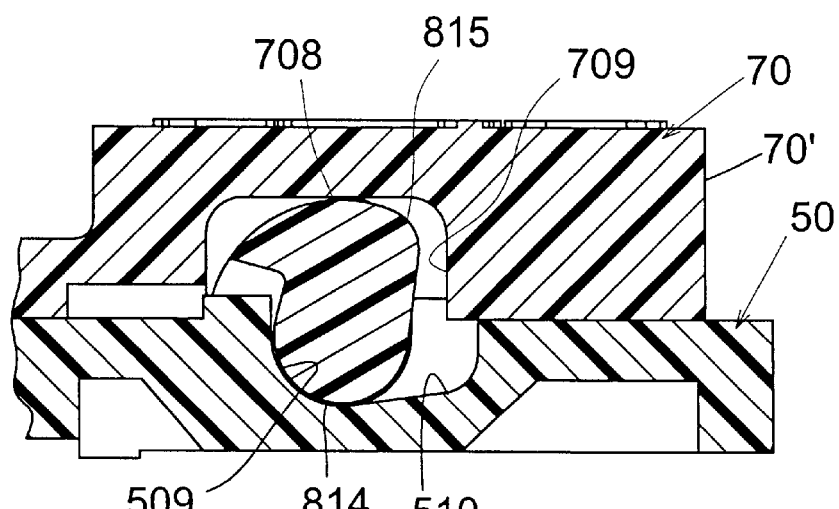
FIG. 43 is a sectional view taken along line 43—43 of FIG. 40.
Figure 44:
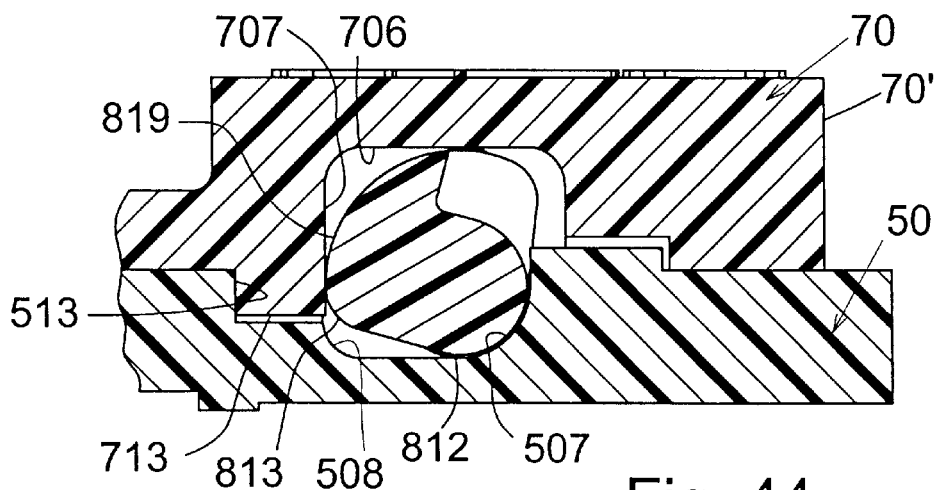
FIG. 44 is a sectional view taken along line 44—44 of FIG. 40.
Figure 45:
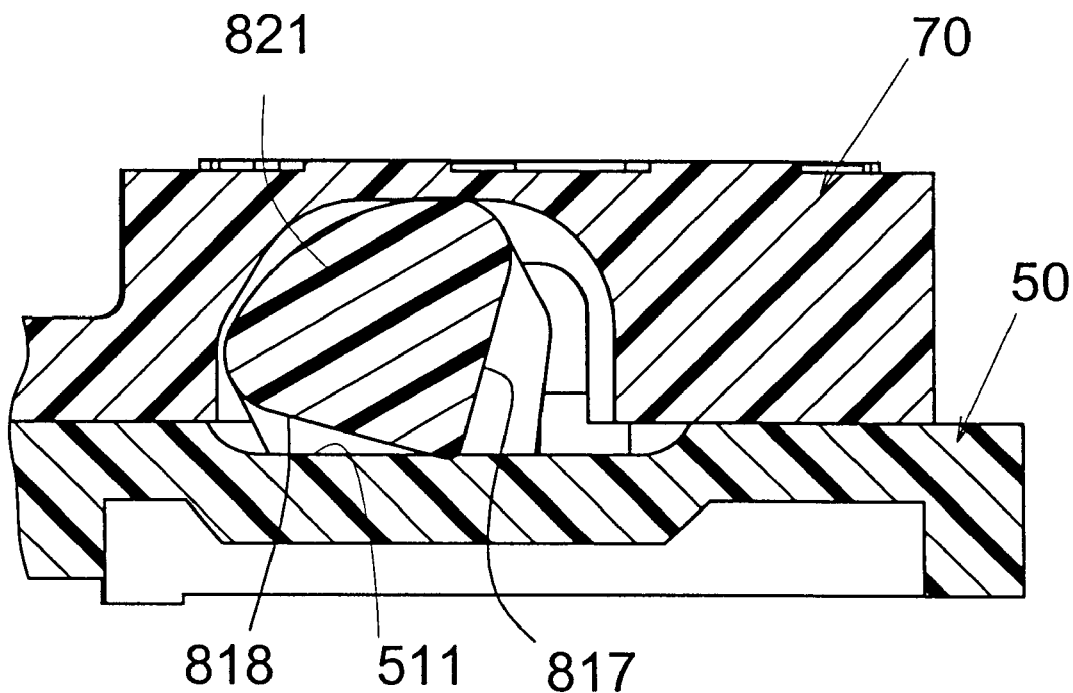
FIG. 45 is a sectional view taken along line 45—45 of FIG. 40.
Figure 46:
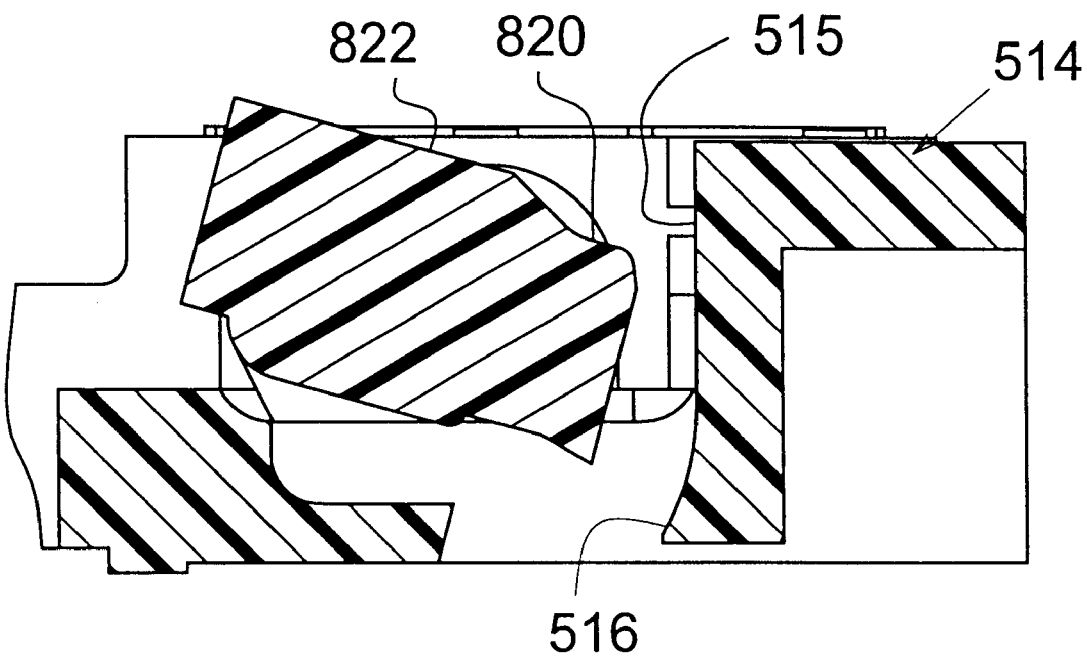
FIG. 46 is a sectional view taken along line 46—46 of FIG. 40.
Figure 50:
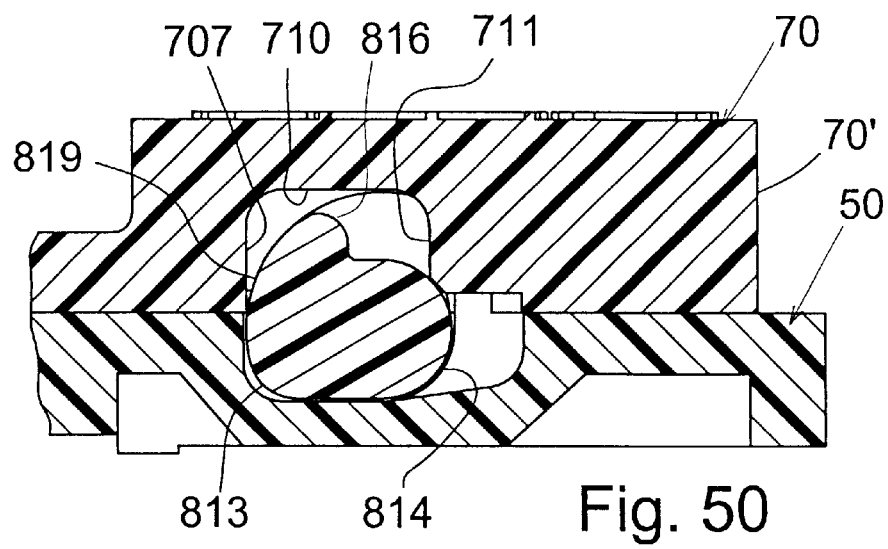
FIG. 50 is a sectional view taken along line 50—50 of FIG. 47.
Figure 51:
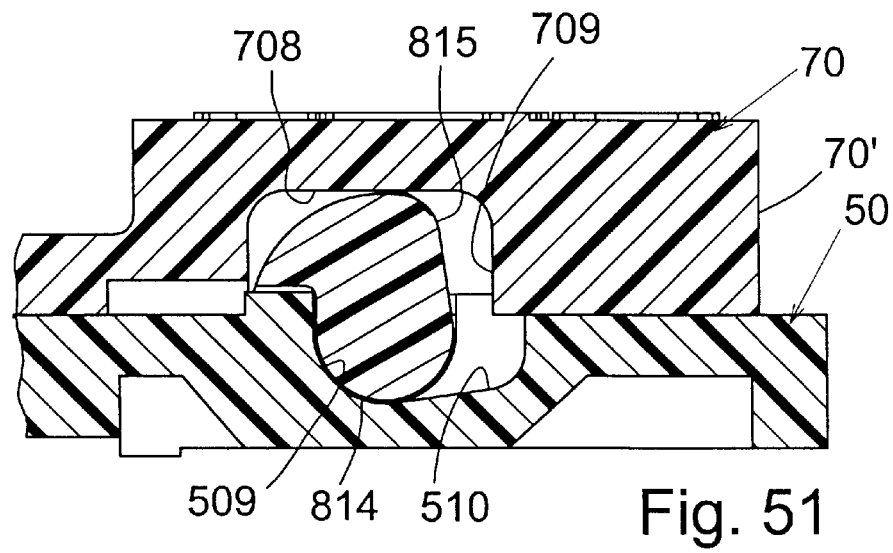
FIG. 51 is a sectional view taken along line 51—51 of FIG. 47.

When the first driving cam 813 pushes the first driven face 707 of the slide cover 70 to make the slide cover 70 leftward slide from the separation position 70" of FIG. 30 to the position as shown in FIGS. 40 and 41, referring to FIG. 44, the position where the first arched face 819 of the driving section 81 of the driving member 80 is connected with the first driving cam 813 just contacts with the first driven face 707 of the slide cover 70. At this time, the slide cover 70 just leftward slides to the end, that is, the slide cover 70 is just positioned in the contact position 70'. The integrated circuit (not shown) just slides into the contact section (not shown) of the conductive member to well contact with the contact section of the conductive member.

Figure 52:
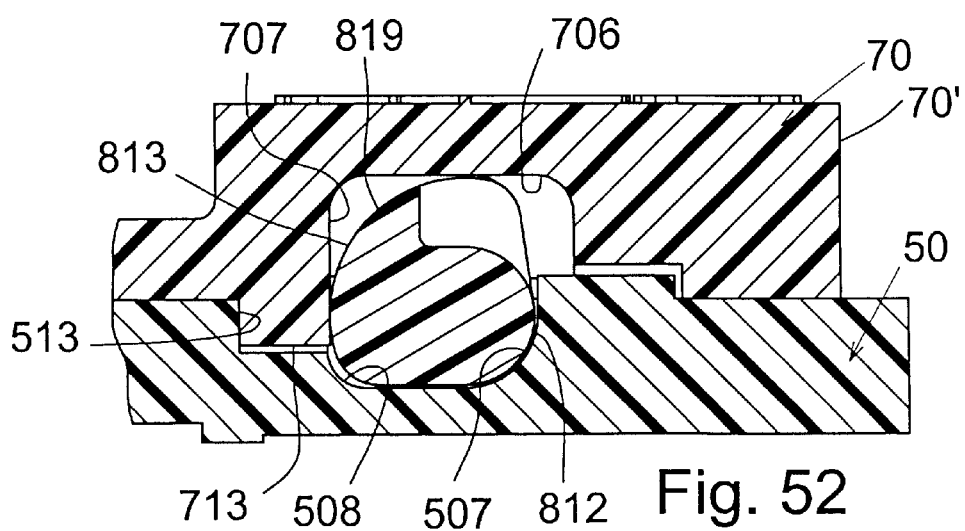
FIG. 52 is a sectional view taken along line 52—52 of FIG. 47.
Figure 53:
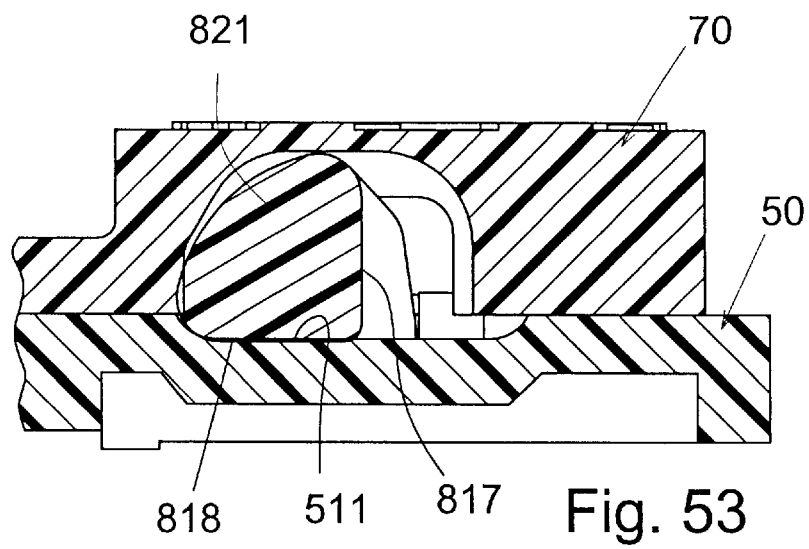
FIG. 53 is a sectional view taken along line 53—53 of FIG. 47.
Figure 54:
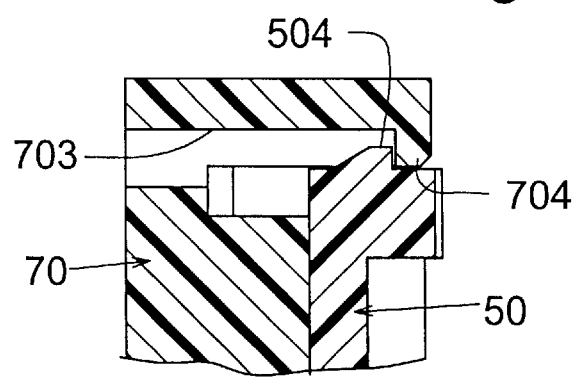
FIG. 54 is an enlarged view of encircled area 54 of FIG. 49.

The axis of the curvature center of the first arched face 819 coincides with the second axis 811 of the driving member 80 and the distances from the first arched face 819 to the second axis 811 are equal. Therefore, when the operating section 83 of the driving member 80 is further counterclockwise rotated, the slide cover 70 always stably keeps in the contact position without further leftward moving. When the operating section 83 of the driving member 80 reaches the totally horizontal state of FIGS. 47 and 48, as shown in FIG. 52, the connecting line between the first driven face 707 of the slide cover 70 and the second axis 811 is parallel to the sliding path 715 of the slide cover 70 so that the slide cover 70 can be firmly and accurately located in the contact position 70'.

Figure 36:
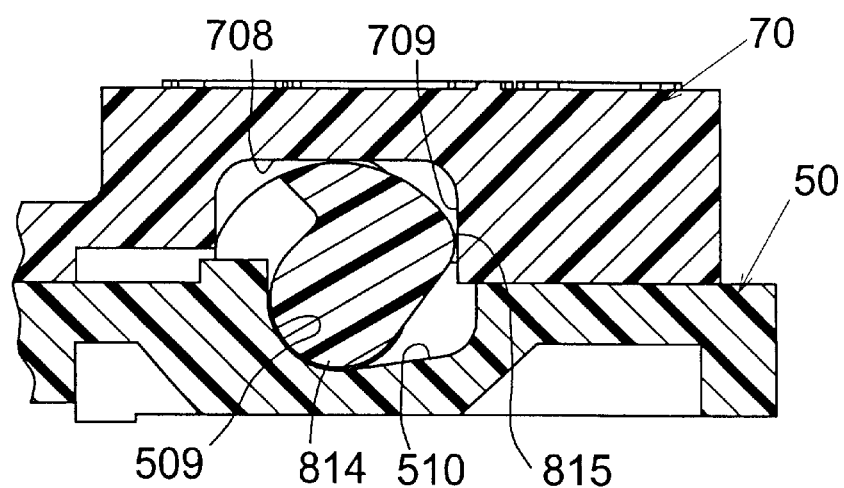
FIG. 36 is a sectional view taken along line 36—36 of FIG. 33.

When the slide cover 70 is slid from the contact position of FIG. 48 to the separation position 70" of FIG. 27, a user simply needs to clockwise rotate the operating section 83 of the driving member 80 as shown in FIG. 36. The second driving cam 815 will first drive the second driven face 709 to make the slide cover 70 slide rightward. When the second driving cam 815 is about to unlatch from the second driven face 709, as shown in FIG. 28, the third driving cam 816 successively drives the third driven face 711 to make the slide cover 70 reach the separation position 70" of FIG. 28.

According to the above arrangement, the zero insertion/extraction force integrated circuit socket of the present invention has the following advantages:

1. In the prior art, the driving cam of the driving section of the L-shaped driving member must be large enough to drive the slide cover to slide through a sufficient travel. Under such circumstance, the cross-section of the driving section will be too large. As a result, the slide cover will protrude to thicken the socket. The above problem existing in the prior art is solved by the present invention.

2. In the prior art, the driving cam of the driving section of the L-shaped driving member is too large so that the gradient of the cross-section of the entire driving section will be too large. As a result, the structural strength of the driving section will be too weak and likely to break. The above problem existing in the prior art is solved by the present invention.

3. In the zero insertion/extraction force integrated circuit socket of the present invention, the first pivot arch shaft section 812, first driving cam 813, second pivot arch shaft section 814, second driving cam 815 and the third driving cam 816 are formed on the driving section 81 of the driving member 80 stage by stage. Therefore, each, cross-section of the driving section 81 can be smaller and the cross-sectional area of each sage can be larger to enhance the torque strength.

4. In the zero insertion/extraction force integrated circuit socket of the present invention, the first pivot arch shaft section 812, second pivot arch shaft section 814 and the third driving cam 816 are axially stage by stage formed on the driving section 81 of the driving member 80 and spaced from each other. The cross-sections of the first pivot arch shaft section 812, second pivot arch shaft section 814 and the third driving cam 816 are not connected with each other. Therefore, each cross-section of the driving section 81 can be smaller and the cross-sectional area of each stage can be larger to enhance the torque strength.

5. In the zero insertion/extraction force integrated circuit socket of the present invention, the first pivot arch recess 507 and second pivot arch recess 509 of the insulating socket 50 cooperate with the first receiving dent 706 and second receiving dent 708 of the slide cover 70 to together support the first pivot arch shaft section 812, second pivot arch shaft section 814 and the first arched face 819 of the driving section 81 of the driving member 80. Therefore, the first pivot arch shaft section 812 and second pivot arch shaft section 814 can be stably pivotally disposed in the insulating socket 50 and smoothly rotated.

6. In the zero insertion/extraction force integrated circuit socket of the present invention, a reinforcing section 511 is disposed at the opening of the first receiving section 505 of the insulating socket 50 for enhancing the strength of the opening of the first receiving section 505.

7. In the zero insertion/extraction force integrated circuit socket of the present invention, the portion of the driving section 81 near the operating section 83, that is, the position of the reinforcing section 511 aligned with the opening of the first receiving section 505 of the insulating socket 50 is formed with corresponding first recess 817 and second recess 818 for avoiding the reinforcing section 511. The other side of the driving section 81 is formed with reinforcing section 821 corresponding to the first and second recesses 817, 818. The reinforcing section 821 is bridged between the first and second recesses 817, 818, whereby the cross-sectional area of the driving section 81 is larger to enhance the torque strength.

8. In the zero insertion/extraction force integrated circuit socket of the present invention, a corner of the insulating socket 50 is formed with a latch tenon 520 for slidably latching with the slide cover 70 and preventing the driving member 80 from being over-turned.

9. In the zero insertion/extraction force integrated circuit socket of the present invention, a corner of the insulating socket 50 is formed with a locating projecting section 514 and resilient latch section 516 for stopping the operating section 83 of the driving member 80, whereby when the operating section 83 is rotated to an erect state, the operating section 83 is latched and located without falling down.

The above embodiment is only used to illustrate the present invention, not intended to limit the scope thereof. Many modifications of the above embodiment can be made without departing from the spirit of the present invention.

What is claimed is:

1. A zero insertion/extraction force integrated circuit socket comprising:
  (A) an insulating socket having:
    (a) a first slide connecting face positioned on one face of the insulating socket;
    (b) multiple insertion holes arranged on the first slide connecting face and passing through the insulating socket;
    (c) two first guiding edges respectively disposed on two opposite edges of the insulating socket, each of the guiding edges having a first latch section projecting therefrom; and (d) a first receiving section formed on one side of the insulating socket and communicating with the first slide connecting face, the first receiving section having:
  (1) a first axis;
  (2) a first pivot arch recess, the first axis serving as the arch center of the first pivot arch recess;
  (3) a first receiving dent connected with the first pivot arch recess;
  (4) a second pivot arch recess, the first axis serving as the arch center of the second pivot arch recess, the second and first pivot arch recesses together forming a U-shaped pivot section; and
  (5) a second receiving dent connected with the second pivot arch recess;
(B) multiple conductive members inserted in the insertion holes of the insulating socket one to one, the conductive members passing through the insertion holes to electrically contact with the circuit board;
(C) a slide cover having:
  (a) a second slide connecting face positioned on one face of the slide cover to slidably contact with the first slide connecting face of the insulating socket, a direction in which the slide cover slides relative to the insulating socket being defined as sliding path;
  (b) multiple through holes arranged on the second slide connecting face of the slide cover and passing through the slide cover, whereby multiple insertion pins of an integrated circuit can be inserted through the through holes into the insertion holes of the insulating socket;
  (c) two second guiding edges respectively disposed on two opposite edges of the slide cover, each guiding edge having a second latch section, the second latch section being slidably latched with the first latch section of the insulating socket, whereby the first and second guiding edges and the first and second slide connecting faces together guide the slide cover to slide relative to the insulating socket; and
  (d) a second receiving section formed on one side of the slide cover, the second receiving section and the first receiving section of the insulating socket being mated to form a receiving cavity, the second receiving section having:
    (1) a first receiving dent having a first driven face not parallel to the second slide connecting face;
    (2) a second receiving dent having a second driven face not parallel to the second slide connecting face; and
    (3) a third receiving dent having a third driven face not parallel to the second slide connecting face; and
(D) a driving member having:
  (a) a driving section hidden in the receiving cavity formed by the first receiving section of the insulating socket and the second receiving section of the slide cover, the driving section being pivotally rotatable about the first axis of the receiving cavity relative to the insulating socket and the slide cover, the driving section having:
    (1) a second axis coinciding with the first axis of the first receiving section of the insulating socket;
    (2) a first pivot arch shaft section, the second axis serving as the arch center of the first pivot arch shaft section, the first pivot arch shaft section being pivotally connected with the first pivot arch recess of the first receiving section;
    (3) a first driving cam radially connected with one side of the first pivot arch shaft section, the first driving cam slidably contacting with the first driven face of the slide cover for driving the slide cover to slide to a contact position where the insertion pins of the integrated circuit fully contact with the conductive members;
    (4) a second pivot arch shaft section, the second axis serving as the arch center of the second pivot arch shaft section, the second pivot arch shaft section being pivotally connected with the second pivot arch recess of the first receiving section of the insulating socket;
    (5) a second driving cam radially connected with one side of the second pivot arch shaft section, the second driving cam slidably contacting with the second driven face of the slide cover for driving the slide cover to slide through a first separation travel of the travel from the contact position to a separation position where the insertion pins of the integrated circuit fully separate from the conductive members, the second driving cam being radially spaced from the first driving cam by a first arch angle; and
    (6) a third driving cam slidably contacting with the third driven face of the slide cover for driving the slide cover to slide through a second separation travel of the travel from the contact position to the separation position where the insertion pins of the integrated circuit fully separate from the conductive members, the third driving cam being spaced from the first driving cam by a second arch angle which is smaller than the first arch angle; and
  (b) an operating section perpendicularly integrally connected with one end of the driving section and exposed to outer side of the insulating socket and the slide cover, whereby by means of shifting the operating section, the driving member is rotated about the first axis, making the second driving cam and third driving cam of the driving member drive the slide cover to slide to the separation position where the insertion pins of the integrated circuit fully separate from the conductive members, at this time, the position where the driving member is positioned being defined as a first position, the first driving cam of the driving member serving to drive the slide cover to slide from the separation position to the contact position where the insertion pins of the integrated circuit just fully contact with the conductive members, at this time, the position where the driving member is positioned being defined as a second position, whereby in the second position, the operating section of the driving member has not yet attached to the locating section of the slide cover and when the operating section of the driving member fully attaches to the locating section of the slide cover, the position where the driving member is positioned is defined as a third position.

2. The zero insertion/extraction force integrated circuit socket as claimed in claim 1, wherein the slide cover further includes a projecting section projecting from the second slide connecting face, the projecting section being positioned between the second receiving section and the through hole and adjacent to one side of the second receiving section, the first driven face extending to one lateral face of the projecting section, the other lateral face of the projecting section serving as a first stop face.

3. The zero insertion/extraction force integrated circuit socket as claimed in claim 2, wherein the insulating socket further has a dent formed on the insulating socket between the first receiving section and the insertion hole, the dent being adjacent to and communicating with one side of the first receiving section, the dent communicating with the first slide connecting face and corresponding to the projecting section of the slide cover for receiving the projecting section, a face of the dent corresponding to the first stop face of the projecting section serving as a second stop face, whereby when the slide cover reaches the contact position, the first stop face contacts with the second stop face of the insulating socket.

4. The zero insertion/extraction force integrated circuit socket as claimed in claim 3, wherein the driving member further has a first arched face which is radially connected with the first driving cam, the axis of the curvature center of the first arch face coinciding with the second axis of the driving member, the distances from every parts of the first arched face to the second axis being not smaller than the distances from every parts of the first driving cam to the second axis, whereby when the driving member reaches the second position, the first driving cam of the driving member keeps contacting with the first driven face of the slide cover, in this travel, the driving member being positioned in the first position or the second position or is positioned between the first and second positions and when the driving member is positioned between the second and third positions, the first arched face always keeps contacting with the first driven face of the slide cover, in this travel, the distances from the first arched face to the second axis being equal so that the slide cover always stably keeps in the contact position.

5. The zero insertion/extraction force integrated circuit socket as claimed in claim 4, wherein the first arched face, first pivot arch shaft section and second pivot arch shaft section of the driving member are rotatably engaged in the first pivot arch recess and second pivot arch recess of the insulating socket and the first receiving dent and second receiving dent of the slide cover, whereby the driving member is pivotally disposed in the first and second pivot arch recesses of the insulating socket and the slide cover.

6. The zero insertion/extraction force integrated circuit socket as claimed in claim 5, wherein a locating projecting section is disposed in a position where the first guiding edge and the first receiving section of the insulating socket intersect each other, the locating projecting section having a locating wall, a rear end of the locating wall being formed with a resilient latch section, a first split being formed on the locating projecting section near the first guiding edge in parallel thereto, whereby the locating wall of the locating projecting section has a rigidity, while the resilient latch section of the locating projecting section has a resilience in a direction along the first split.

7. The zero insertion/extraction force integrated circuit socket as claimed in claim 5, wherein a second split is formed on the locating projecting section near the first guiding edge in parallel thereto, whereby the locating projecting section further has a resilient section, a latch tenon being formed on inner side of the resilient section of the locating projecting section for slidably latching with the slide cover.

8. The zero insertion/extraction force integrated circuit socket as claimed in claim 5, wherein a portion of the operating section of the driving member near the driving section is further formed with: a locating section, when the driving member is positioned in the first position, the locating section contacting with the locating wall of the insulating socket; and a locating latch section formed at rear end of the locating section, the locating latch section being not positioned on the second axis, the driving member being rotated to latch the locating latch section with the resilient latch section of the insulating socket, whereby the operating section of the driving member is kept in a position erect from the insulating socket.

9. The zero insertion/extraction force integrated circuit socket as claimed in claim 6, wherein the driving member has two first pivot arch shaft sections and two second pivot arch shaft sections which are not connected with each other.

10. The zero insertion/extraction force integrated circuit socket as claimed in claim 6, wherein the driving member has multiple first pivot arch shaft-sections and multiple second pivot arch shaft sections which are not connected with each other.

11. The zero insertion/extraction force integrated circuit socket as claimed in claim 9, wherein the number and position of the first pivot arch recess and second pivot arch recess of the insulating socket respectively correspond to the number and position of the first pivot arch shaft sections and second pivot arch shaft sections.

12. The zero insertion/extraction force integrated circuit socket as claimed in claim 10, wherein the number and position of the first pivot arch recess and second pivot arch recess of the insulating socket respectively correspond to the number and position of the first pivot arch shaft sections and second pivot arch shaft sections.

13. The zero insertion/extraction force integrated circuit socket as claimed in claim 1, wherein a reinforcing section is further formed in a communicating portion between the first receiving section and the first slide connecting face of the insulating socket, a thickness from the reinforcing section to the bottom face of the insulating socket being larger than a thickness from the first receiving section to the bottom face of the insulating socket.

14. The zero insertion/extraction force integrated circuit socket as claimed in claim 1, wherein the driving member further has: a first recess; a second recess, when the driving member is positioned in the first position and the third position, the first and second recesses respectively corresponding to the reinforcing section of the insulating socket; and a reinforcing section bridged between the first and second recesses to compensate the thickness of the cross-section of the first and second recesses as to enhance the strength of the driving section of the driving member.

15. The zero insertion/extraction force integrated circuit socket as claimed in claim 1, wherein the first and second pivot arch shaft sections and the third driving cam are all formed on the driving section of the driving member without connecting with each other, whereby the cross-section of any two adjacent portions has greater strength.

* * * * *